United States Patent
Hirano

(10) Patent No.: US 6,711,058 B1
(45) Date of Patent: Mar. 23, 2004

(54) ERASE METHOD FOR NONVOLATILE SEMICONDUCTOR STORAGE DEVICE AND ROW DECODER CIRCUIT FOR FULFILLING THE METHOD

(75) Inventor: Yasuaki Hirano, Yamatokooriyama (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/598,384

(22) Filed: Jun. 21, 2000

(30) Foreign Application Priority Data

Jun. 21, 1999 (JP) .......................................... 11-173880

(51) Int. Cl.$^7$ ............................................. G11C 16/04
(52) U.S. Cl. ............................. 365/185.11; 365/185.18; 365/185.29
(58) Field of Search ..................... 365/185.11, 185.17, 365/185.18, 185.26, 185.27, 185.28, 185.29, 185.33

(56) References Cited

U.S. PATENT DOCUMENTS

| | | | | |
|---|---|---|---|---|
| 5,267,209 A | * | 11/1993 | Yoshida .................. | 365/185.33 |
| 5,371,705 A | * | 12/1994 | Nakayama et al. .... | 365/189.11 |
| 5,894,438 A | * | 4/1999 | Yang et al. ............. | 365/185.29 |
| 5,959,890 A | * | 9/1999 | Yamamoto et al. ..... | 365/185.33 |
| 5,966,331 A | * | 10/1999 | Shiau et al. ........... | 365/185.18 |
| 5,978,264 A | * | 11/1999 | Onakado et al. ....... | 365/185.11 |
| 6,144,582 A | * | 11/2000 | Atsumi et al. ......... | 365/185.11 |
| 6,160,737 A | * | 12/2000 | Hsu et al. .............. | 365/185.29 |
| 6,212,103 B1 | * | 4/2001 | Ahrens et al. ......... | 365/185.29 |
| 6,256,228 B1 | * | 7/2001 | Hirano ................... | 365/185.29 |
| 6,285,591 B1 | * | 9/2001 | Tanaka et al. ......... | 365/185.18 |
| 6,512,692 B2 | * | 1/2003 | Yamauchi et al. ..... | 365/185.11 |

FOREIGN PATENT DOCUMENTS

| JP | 9-162373 | 6/1997 |
|---|---|---|
| JP | 2001357699 | * 12/2001 |

OTHER PUBLICATIONS

Kato et al., "AND cell structure for a 3V–only 64 Mbit Flash Memory", Technical Report of IEICE, ICD93–128, p. 37, 1993.
Onoda et al., "A novel cell structure suitable for a 3 volt operation, sector erase flash memory", Technical Report of IEICE, ICD93–26, p. 15, 1993.
Kim et al., "A novel dual string NOR (DuSNOR) memory cell technology scalable to the 256 Mbit and 1 Gbit flash memories", IEDM 95–263, pp. 11.1.1–4, 1995.
Yamauchi et al., "A new cell structure for sub–quarter micron high density flash memory", IEDM 95–267, pp. 11.2.1–4, 1995.
Hirano et al., "A sensing scheme for a ACT flash memory", Technical Report of IEICE, ICD97–21, pp. 37–42, 1997.

* cited by examiner

Primary Examiner—Trong Phan
(74) Attorney, Agent, or Firm—Morrison & Foerster LLP

(57) ABSTRACT

For erasing a block 0, a voltage Vpp is applied to select word lines WL0–WL31, while a voltage Vneg is applied to each of the substrate (well) and sub-bit lines SBL0–SBL4096. Also, a voltage Vneg is applied to word lines WL32–WL63 of a non-select block 1, while the voltage Vneg is applied to the substrate (well) and the sub-bit lines SBL. Thus, the voltage Vneg is applied to the control gates, sources and drains of all the memory cells within the non-select block 1 and the substrate (well), so as to make them equal in voltage to one another. Therefore, there occur no mis-reads during the reading. Further, the capacity between the non-select word lines WL and the substrate (well) can be neglected, and the occupancy ratio of the charge pump for use of supply of the negative voltage can be reduced by an extent corresponding to 90% or more of the conventional counterpart. As a result, mis-reads due to substrate disturb during the erasing can be prevented.

4 Claims, 16 Drawing Sheets

CONDITIONS : Vg=0V, Vd=Vs= FLOATING, Vsub=−8V

ERASE METHOD FOR NONVOLATILE SEMICONDUCTOR STORAGE DEVICE AND ROW DECODER CIRCUIT FOR FULFILLING THE METHOD

BACKGROUND OF THE INVENTION

The present invention relates to an erase method for nonvolatile semiconductor storage devices capable of preventing disturb at erasing, particularly, in floating gate type nonvolatile semiconductor storage devices, and also relates to a row decoder circuit for fulfilling the method.

In recent years, with the trend toward higher integration of flash memories, there has been a demand for lower power consumption. For this purpose, a variety of attempts to achieve lower power consumption have been made by using the FN (Fowler-Nordheim) tunneling phenomenon for program and erase operations. Flash memories using the FN tunneling phenomenon for program and erase operations like this are called FN-FN type flash memories.

Meanwhile, the flash memories can be classified also depending on differences in the structure of memory cell array or the like. The major four classes, as have been announced from various companies, are listed below:

[1] AND type flash memories reported in Technical Report of IEICE (the Institute of Electronics, Information and Communication Engineers of Japan), ICD93-128, p. 37, 1993, "AND Type Cell for 3V Single Power Supply 64 Mbit Flash Memories";

[2] DINOR type flash memories reported in Technical Report of IEICE, ICD93-26, p. 15, 1993, "3V Single Power Supply DINOR Type Flash Memories";

[3] DuSNOR type flash memories reported in Technical Digest, pp. 263–266, 1995, "A Novel Dual String NOR (DuSNOR) Memory Cell Technology Scalable to the 256 Mbit and 1 Gbit Flash Memories"; and

[4] ACT (Asymmetrical Contactless Transistor) type flash memories reported in IEDM Technical Digest, pp. 269–270, 1995, "A New Cell Structure for Sub-quarter Micron High Density Flash Memory" or
in Technical Report of ICICE, ICD97–21, p. 37, 1997, "Discussion on Sense Systems for ACT Type Flash Memories".

In these flash memories, which are electrically programmable and erasable on memory cells, a voltage is applied to the drains/sources or gates of select cells while a voltage is applied also to the drains/sources or gates of non-select memory cells, for program and erase operations. During these operations, there is a possibility that mis-reads occur because threshold of the non-select memory cells would be changed by an effect of the voltage application.

In recent years, a system in which a negative voltage is applied to the substrate (well), has begun to be used in order to reduce the absolute values of voltages used inside the flash memory during the erasing. When a voltage is applied to the substrate (well) in program and erase operations, this applied voltage would cause non-select memory cells to be put into a light erased state as described above, adversely affecting the threshold of the non-select memory cells. Hereinafter, such a phenomenon will be referred to as substrate disturb. This substrate disturb tends to grow stricter as the flash memory goes larger capacity.

This substrate disturb is explained by taking the ACT type flash memory as an example. First, the principle of operation of the ACT type flash memory is explained based on a memory cell shown in FIG. 19.

The ACT type flash memory is so constructed that a control gate 1, an interlayer insulator 2, a floating gate 3 and a tunnel oxide 4 are formed in layers so as to stretch over a drain 6 and a source 7 provided in a substrate (P-type well) 5. It is noted that the drain 6 and the source 7 have different donor concentrations. Then, in the program operation in which electrons are pulled out from the floating gate 3, a negative voltage of −8 V is applied to the control gate 1 and a positive voltage of +5 V is applied to the drain 6 so that the source 7 is put into a floating state, where the electrons are pulled out from the floating gate 3 by the FN tunneling phenomenon. As a result, the threshold of the memory cell to be programmed is lowered to about 1.5 V.

Also, in the erase operation in which electrons are injected into the floating gate 3, a positive voltage of +10 V is applied to the control gate 1, a negative voltage of −8 V is applied to the source 7 and a negative voltage of −8 V is applied to the drain 6, where the electrons are injected into the floating gate 3 by the FN tunneling phenomenon. As a result, the threshold of the cell to be erased is increased so as to rise to about 4 V or more. Like this, the ACT type flash memory is an FN-FN type flash memory.

Further, in the read operation, a voltage of 3 V is applied to the control gate 1, a voltage of 1 V is applied to the drain 6 and a voltage of 0 V is applied to the source 7, where a current flowing through the cell is sensed separately by a sense circuit, by which data is read out.

Table 1 lists the applied voltages for the program, erase and read operations.

TABLE 1

Applied voltages in flash memory

|  | Control gate | Drain | Source | Substrate (P-type well) |
| --- | --- | --- | --- | --- |
| Program | −8 V | 5 V | Open | 0 V |
| Erase | 10 V | −8 V | −8 V | −8 V |
| Read | 3 V | 1 V | 0 V | 0 V |

Next, for explanation of the substrate disturb at erasing, the erase operation is described in more detail with an array structure shown in FIG. 1. As schematically shown in FIG. 1, the array structure of the ACT type flash memory is a virtual-ground type array structure in which one bit line BL is shared by two memory cells. Then, by sharing the individual bit lines and by using a diffusion layer for sub-bit lines (SBL0, SBL1, SBL2, . . . ), the number of contacts is reduced so that the array area is considerably reduced, thus making it possible to achieve high integration.

It is noted here that BL0–BL4096 are main bit lines, SBL0–SBL4096 are sub-bit lines formed of the diffusion layer (hierarchically different from the main bit lines BL0–BL4096), and WL0–WL63 are word lines. Also, SG0 and SG1 are gate lines of select transistors for selecting a block 1 comprised of word lines WL0–WL31 and block 2 comprised of word lines WL32–WL63. It is noted that blackened square symbols in the figure represent contact portions between the main bit lines BL and the sub-bit lines SBL. In addition, two sides of the drain and the source to be connected to a sub-bit line SBL common to neighboring memory cells are different in donor concentration from each other.

FIG. 21 schematically shows a cross section of an ACT type flash memory device, where from above to below, a word line (control gate 1) WL, an interlayer insulator 2, a floating gate (FG) 3 and a sub-bit line (diffusion layer) SBL are arranged in a layered structure. The sub-bit line SBL provided commonly under end portions of neighboring floating gates 3, 3 is different in donor concentration between the drain 6 side and the source 7 side.

In the case of the ACT type flash memory having the above constitution, the erase operation is performed on a block-by-block basis. That is, for erasing, in order to raise the threshold of the memory cell, a voltage of +10 V is applied to the word lines WL0–WL31 connecting to the control gate 1 of a select block (block 0 in this case). Further, a voltage of −8 V is applied to the substrate (well) 5 and the main bit lines BL0–BL4096. In this case, the voltage of the gate line SG0 is 0 V, making the select transistors on, so that a voltage of −8 V is outputted to the sub-bit lines SBL0–SBL4096 formed of the diffusion layer. As a result, a high electric field is generated between the floating gate 3 and the channel of each memory cell, so that electrons are injected into the floating gate 3 by the FN tunneling phenomenon, with the result that the threshold of the memory cell rises to 4 V or more.

Meanwhile, in a non-select block (block 1 in this case), Vss (0 V) is applied to the word lines WL32–WL63. Also, −8 V is applied to the gate line SG1, making the select transistors off. Accordingly, the sub-bit lines SBL0–SBL4096 connected to the select transistors associated with the gate line SG1 come to a floating state. In this case, since the substrate (well) 5 is common to all the memory cells, −8 V is applied thereto so that an electric field not so high as that of the select block is generated also between the floating gate 3 and the substrate (well) 5. As a result, electrons are injected into the floating gate 3.

Such injection of electrons into the floating gate 3 in the non-select block noticeably occurs at memory cells of low threshold in the programmed state (i.e., memory cells of data "0").

Now the substrate disturb is discussed with respect to a 64 M flash memory containing 512 blocks each having a block size of, for example, 16 KB. In the case where each block is reprogrammed one million times, given each erase time of 2 ms, the disturb time, which is a total of time durations of application to the non-select block, can be expressed by the following Equation (1):

$$511 \times 1,000,000 \text{ times} \times 2 \text{ ms} \approx 10^6 \text{ sec} \quad (1)$$

FIG. 20 shows an example of the substrate disturb in by a conventional erase method. As can be understood from the figure, after $10^6$ sec., which is the disturb time, the threshold of the memory cell in the programmed state (data "0") becomes above 3 V, higher than the Ref (reference) voltage of 3 V in the sense circuit at a read. Thus, data "0" would be mis-sensed as data "1", resulting in occurrence of a mis-read.

Also, in the case where a negative voltage is applied to the substrate (well) 5 at erasing as described above, there arises a need for a negative voltage charge pump that boosts the power supply voltage to generate a negative voltage to be applied to the substrate (well) 5. Then, because of quite large capacity accompanying the substrate (well) 5, the charge pump for generating this negative voltage needs to have quite large power. For the formation of a 64 M flash memory, which involves a capacity as much as 32000 pf that accompanies the substrate (well) 5, given that the rise time at erasing is 100 μs (assuming that the erase pulse time is 1 ms and that the rise time takes 10%), then an electric current of about 30 mA is required.

Further, the charge pump efficiency is generally low and, in particular, a charge pump that generates negative voltage has an efficiency of 10% or so, with the result of an increased area. Therefore, in order to implement the charge pump, the layout area for the charge pump is about 5% relative to the chip area, the layout area of the charge pump being a considerably large one.

Such a nonvolatile storage device designed to relax the substrate disturb as well as the increase in the layout area of the charge pump due to an increase in the well capacity is disclosed in Japanese Patent Laid-Open Publication HEI 9-162373. In the nonvolatile storage device disclosed in Japanese Patent Laid-Open Publication HEI 9-162373, for example, the well of a 64 M flash memory is divided into 16 in the row direction. By this division, the disturb time results in $$31 \times 1,000,000 \text{ times} \times 2 \text{ ms} = 62,000 \text{ sec.}$$

Therefore, as can be understood from FIG. 20, even after 62,000 sec., which is the disturb time, the threshold of the memory cell in the programmed state holds a state of about 2 V, not higher than the Ref voltage of the sense circuit at a read, thus making a normal read achievable. also, the capacity of each divisional well is about 2000 pf, so that the current supply power necessary for the charge pump is also reduced. Therefore, the area necessary for the formation of the charge pump is also reduced to 1% or lower relative to the chip area.

However, the nonvolatile storage device disclosed in Japanese Patent Laid-Open Publication HEI 9-162373 has the following problems. That is, isolation of the well would give rise to the need of providing an isolation region, causing the area of the memory cell array to increase, where the chip area would increase 8% or so. Due to this, in the method by isolating the well, although a margin can be saved for substrate disturb, there is a problem that the whole chip area would be increased.

Still, the disturb is not completely eliminated, and voltage applications for rewriting such as programming and erasing would act as a stress, so that, for example, executing one million times of rewriting would cause hole trap or other defects to occur. Then, because of these defects, there can appear some memory cells whose threshold in the programmed state go higher than 3 V, which is the Ref voltage in the sense circuit.

SUMMARY OF THE INVENTION

Accordingly, an object of the present invention is to provide an erase method for nonvolatile semiconductor storage devices capable of preventing mis-reads due to substrate disturb at erasing and of reducing the current of the negative voltage charge pump for the generation of the voltage applied to the substrate (well) and also reducing the layout area for the charge pump, as well as to provide a row decoder circuit for realizing the erase method.

In order to achieve the object, there is provided an erase method for a nonvolatile semiconductor storage device in which floating gate field effect transistors each having a control gate, a floating gate, a drain and a source and being electrically information programmable and erasable are arrayed in a matrix shape on a substrate or well, and which comprises a plurality of row lines connected to the control gate of each of floating gate field effect transistors arrayed along a row direction, and a plurality of column lines connected to the drain and source of each of floating gate field effect transistors arrayed along a column direction, the method comprising:

using the Fowler-Nordheim tunneling phenomenon for both programming and erasing; and for erasing, applying a negative first voltage to the substrate or well and applying a positive voltage to select row lines, while applying a negative second voltage to non-select row lines.

With this constitution, for an erase of the nonvolatile semiconductor storage device with the use of the FN tunneling phenomenon, a negative voltage is applied to both the substrate (well) and non-select row lines. Therefore, by setting the applied voltage for the substrate (well) and the applied voltage for the non-select row lines so that the erase operation is not affected by any substrate disturb, any increase of the threshold voltage of programmed memory cells can be prevented even if the nonvolatile semiconductor storage device is iteratively rewritten. As a result, mis-reads of the programmed memory cells can be prevented.

Further, the voltage difference between the. substrate (well) and the non-select row lines is reduced, so that the electrical capacity between the substrate (well) and the non-select row lines is reduced. As a result, the layout area of the charge pump that supplies the negative voltage to the substrate (well) can be reduced.

In one embodiment of the present invention, the negative second voltage has an absolute value not larger than an absolute value of the negative first voltage.

With this constitution, since the absolute value of the negative second voltage is set lower than the absolute value of the negative first voltage, misoperations of non-erase memory cells can be prevented. Further, by setting the absolute values of the negative first and second voltages equal to each other, the substrate disturb can completely be prevented.

Further, the voltage difference between the substrate (well) and the non-select word lines can be made smaller than conventional, and the electrical capacity between the substrate (well) and the non-select word lines can be reduced so that the current necessary for charging and recharging to the capacity can be reduced. Therefore, supply power of the charge pump that generates the negative voltage supplied to the substrate (well) can be reduced so that the area of the charge pump can be reduced.

Also, there is provided a row decoder for applying a select voltage and a non-select voltage to select word lines and non-select word lines of a nonvolatile semiconductor storage device, the select word lines and the non-select word lines being determined according to an address signal, on a mode-by-mode basis for each of a program mode, a read mode and an erase mode, the row decoder comprising:

control voltage output means for, on the mode-by-mode basis, outputting a control voltage responsive to select/non-select information which is determined according to the address signal;

select voltage output means for, on the mode-by-mode basis, outputting a select voltage responsive to a select state which is determined according to the address signal;

non-select voltage output means for, on the mode-by-mode basis, outputting a non-select voltage responsive to a non-select state which is determined according to the address signal; and applied voltage select means for, in the erase mode, selecting either one of the select voltage derived from the select voltage output means or the non-select voltage derived from the non-select voltage output means according to the control voltage derived from the control voltage output means, and outputting the selected voltage au to select word lines while outputting the non-selected voltage to non-select word lines.

With this constitution, in the erase mode, a control voltage responsive to select/non-select information is outputted according to the address signal by the control voltage output means. Then, the select voltage derived from the select voltage output means is outputted to select word lines according to the control voltage by the applied voltage select means. Also, the non-select voltage derived from the non-select voltage output means is outputted to non-select word lines. In this case, the voltage applied to the substrate (well) is given by the negative first voltage, the select voltage is given by the positive voltage, the non-select voltage is given by the negative second voltage, and the values of the two negative voltages are set so that the erase operation is not affected by any substrate disturb. By these settings, increase of the threshold voltage of programmed memory cells due to iterated rewriting can be prevented. As a result, mis-reads of the programmed memory cells can be prevented.

Also, there is provided a row decoder for applying a select voltage and a non-select voltage to select word lines and non-select word lines of a nonvolatile semiconductor storage device, the select word lines and the non-select word lines being determined according to an address signal, on a mode-by-mode basis for each of a program mode, a read mode and an erase mode, the row decoder comprising:

control voltage output means for, on the mode-by-mode basis, outputting a control voltage responsive to select/non-select information which is determined according to the address signal;

high voltage output means for, on the mode-by-mode basis, outputting a high voltage not less than a specified voltage responsive to a select state which is determined according to the address signal;

low voltage output means for, on the mode-by-mode basis, outputting a low voltage lower than the high voltage responsive to a non-select state which is determined according to the address signal; and applied voltage select means for, in the erase mode, selecting either one of the high voltage derived from the high voltage output means or the low voltage derived from the low voltage output means according to the control voltage derived from the control voltage output means, and outputting the high voltage to select word lines as the select voltage while outputting the low voltage to non-select word lines as the non-select voltage.

With this constitution, in the erase mode, a control voltage responsive to select/non-select information is outputted according to the address signal by the control voltage output means. Then, the high voltage derived from the high voltage output means is outputted as the select voltage to select word lines according to the control voltage by the applied voltage select means. Also, the low voltage derived from the low voltage output means is outputted as the non-select voltage to non-select word lines. In this case, the voltage applied to the substrate (well) is given by the negative first voltage, the select voltage is given by the positive voltage, the non-select voltage is given by the negative second voltage, and the values of the two negative voltages are set so that the erase operation is not affected by any substrate disturb. By these settings, increase of the threshold voltage of programmed memory cells due to iterated rewriting can be prevented. As a result, mis-reads of the programmed memory cells can be prevented.

Further, the output voltage from the high voltage output means is set normally higher than the output voltage from the low voltage output means. Therefore, the select operation by the applied voltage select means for selection of the output voltages from the high voltage output means and the low voltage output means is simplified, compared with the case of an embodiment of the invention in which the relationship of magnitude between the output voltage from the select voltage output means and the output voltage from the non-select voltage output means varies from mode to mode. Therefore, the constitution of the applied voltage select means becomes simpler than that of the foregoing embodiment of the invention, so that occupancy area of the applied voltage select means is reduced.

In one embodiment of the present invention, in the erase mode, the select voltage is a positive voltage, while the non-select voltage is a negative voltage; and an absolute value of the non-select voltage is not larger than an absolute value of the negative voltage applied to the substrate or well of the nonvolatile semiconductor storage device.

With this constitution, in the erase mode, since the absolute value of the non-select voltage applied to the non-select word lines is smaller than the absolute value of the voltage applied to the substrate (well), misoperations of non-erase memory cells can be prevented. Further, by setting the absolute values of the voltage applied to the substrate (well) and the voltage applied to the non-select word lines equal to each other, the substrate disturb can completely be prevented.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

First Embodiment

Figure 1:
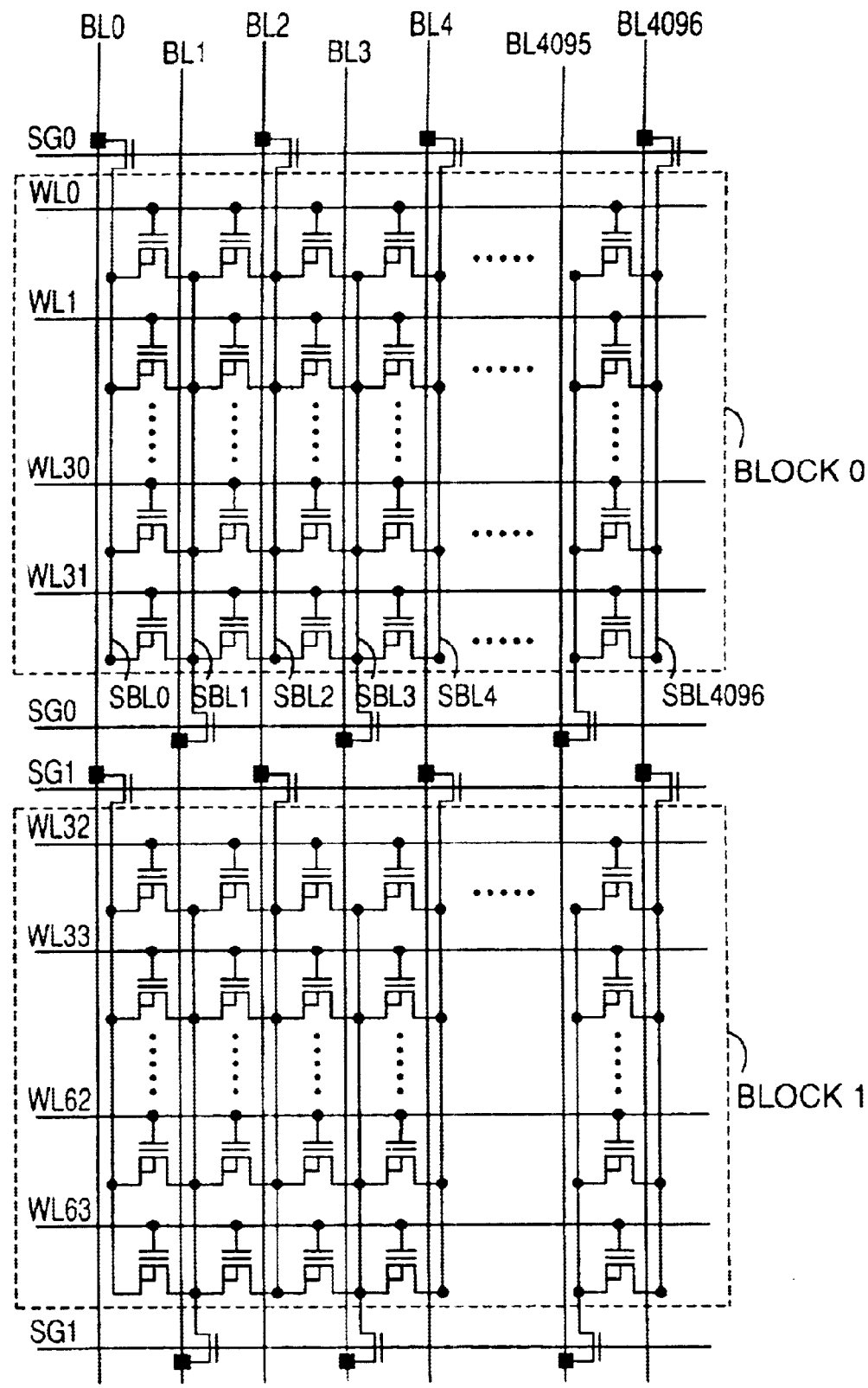
FIG. 1 is a view showing an array structure of an ACT type flash memory to which the erase method for nonvolatile semiconductor storage devices according to the present invention is applied.

FIG. 1 shows an array structure of a nonvolatile semiconductor storage device to which the erase method for nonvolatile semiconductor storage devices according to this ba embodiment is applied. This nonvolatile semiconductor storage device is an ACT type flash memory formed by a virtual-ground type array, and its constitution is as described in the paragraphs for the prior art, except that this ACT type flash memory is made up of 512 blocks where 32 word lines WL0–WL31 are taken as 1 block.

The array structure of this embodiment is similar to that of the conventional ACT type flash memory. Also, with regard to this ACT type flash memory, voltages applied to the word lines WL, the bit lines BL and the substrate (well) at erasing are shown in Table 2:

TABLE 2

Applied voltages at erasing

| | | Node | Voltage |
|---|---|---|---|
| Word line | Select | WL0–WL31 | Vpp (10 V) |
| | Non-select | WL32–WL16383 | Vneg (−8 V) |
| Bit line | | BL0–BL4096 | Vneg (−8 V) |
| Substrate (well) | | | Vneg (−8 V) |

The erasing is executed on the block basis, and Table 2 shows a case of erasing the block 0. As shown in Table 2, a voltage Vpp (10 V) is applied to selected word lines WL0–WL31. Meanwhile, a voltage Vneg (−8 V) is applied to the substrate (well) and the main bit lines BL0–BL4096.

On the other hand, 0 V is applied to the gate line SG0 Then, select transistors to the gates of which this gate line SG0 is connected are turned on. As a result of this, the voltage Vneg applied to the main bit lines BL0–BL4096 is applied to the individual sub-bit lines SBL0–SBL4096 formed of the diffusion layer within the block 0 via the select transistors, respectively.

Then, in the select block 0, as a result of the voltage application to the word lines WL and the sub-bit lines SBL, the EN tunneling phenomenon occurs at all the memory cells, and electrons are injected through the channel layer into the floating gate in each memory cell.

As a consequence, the threshold of each memory cell increases 4 V or higher, and the erasing is achieved.

On the other hand, in the non-select block 1, a voltage Vneg (−8 V) is applied to the word lines WL32–WL63. Meanwhile, the voltage Vneg (−8 V) is applied to the substrate (well) and the main bit lines BL0–BL4096, which are in common to the foregoing select block 0. Then, 0 V is applied to the gate line SG1 so that select transistors to the gates of which the gate line SG1 is connected are turned on, by which the voltage Vneg (−8 V) is applied to the sub-bit lines SBL formed of the diffusion layer within the block 1.

Accordingly, the control gates, sources, drains and substrates (wells) of all the memory cells within the non-select block 1, to all of which the voltage Vneg (−8 V) is applied, become the same voltage level. As a result of this, the non-select block 1 undergoes no substrate disturb.

Figure 2:
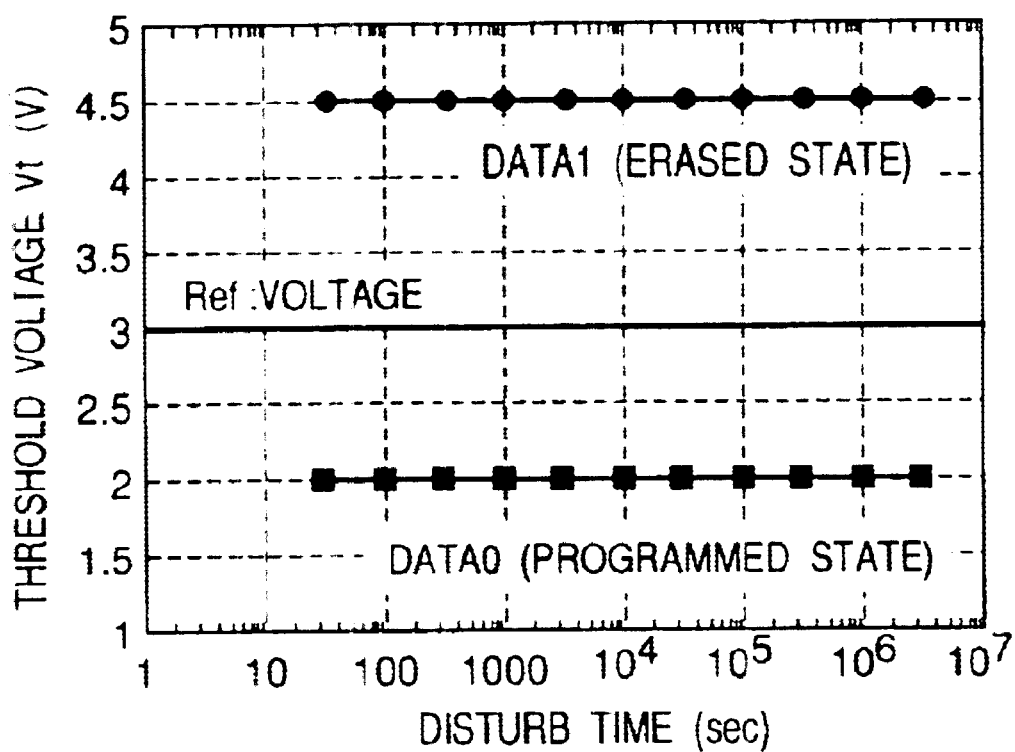
FIG. 2 is a chart showing the relationship between the total application time to a non-select block and the threshold voltage according to the erase method of the invention.

With respect to the non-select block 1 in this embodiment, the relationship between disturb time and variations of threshold voltage Vt of a memory cell in the erased state (data "1") and a memory cell in the programmed state (data "0") is shown in FIG. 2. Referring to FIG. 2, the threshold voltage Vt of the memory cell of low threshold in the programmed state hardly fluctuates even if the total disturb time exceeds $10^6$ sec.

Therefore, in a 64 M flash memory containing 512 blocks each having a block size of, for example, 16 KB, even if data "0" and data "1" are sensed with a Ref voltage of 3 V by the sense circuit (not shown) connected to the main bit lines at a data read after each block has been rewritten one million times, the data can be read out correctly without any mis-reads.

It is noted that even in a non-select block other than the block 1, by applying similar voltages, fluctuations of the threshold voltage Vt of memory cells due to substrate disturb at erasing can be suppressed.

Here is discussed the supply of a negative voltage to the substrate (well). The capacity accompanying the substrate (well) amounts to as much as 32000 pf as described before. Most of the capacity in this case is. attributed to the capacity between the substrate (well) and the word line WL formed of polysilicon or the like via the floating gate, the capacity amounting to as much as about. 31000 pf or more. However, in this embodiment, because the non-select word lines WL32–WL16383 become equal in voltage (Vneg) to the substrate (well), the capacity between the substrate (well) and the word line WL, amounting to as much as about 31000 pf or more, can be neglected, thus the relevant capacity being 1000 pf or less.

Therefore, the amount of current necessary for supplying the negative voltage to the substrate (well) is 3% or less of the conventional counterpart. As a result, the ratio of the layout area of the charge pump that supplies the negative voltage to the chip area is 0.5% or less. This means that the ratio of the charge pump to the chip area can be reduced by 90% or more of the conventional counterpart.

Like this, in this embodiment, because the same voltage Vneg (−8 V) as with the substrate (well) is applied to the non-select word lines WL at erasing, the control gates, sources, drains and substrates (wells) of all the memory cells within the non-select block become the same voltage level, so that the non-select block undergoes no substrate disturb. Also, because the non-select word lines WL become equal in voltage as the substrate (well), the capacity between the non-select word lines WL and the substrate (well) can be neglected. Therefore, the ratio of the charge pump for supplying the negative voltage to the chip area can be reduced by 90% or more of the conventional counterpart.

Figure 3:
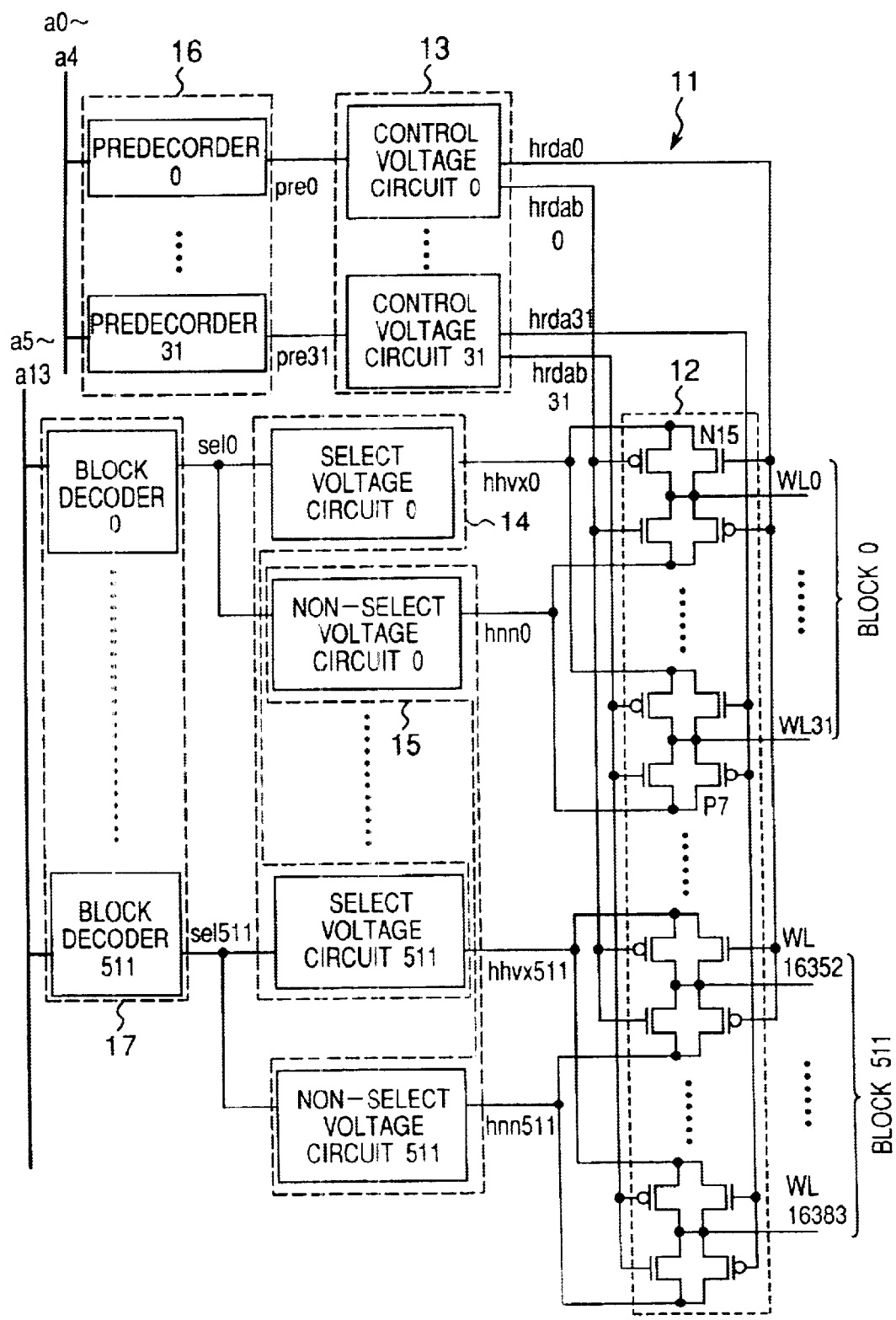
FIG. 3 is a block diagram of a row decoder which enables the erase method of the invention.

Next, a row decoder that enables this embodiment by applying various voltages to word lines WL of memory cells is described. FIG. 3 shows a block diagram of an example of the row decoder. This row decoder 11 is composed roughly of a driver section 12 for outputting various voltages to word lines WL, a control voltage circuit section 13, a select voltage circuit section 14, a non-select voltage circuit section 15, a predecoder section 16 and a block decoder section 17. Construction and operation of the row decoder 11 are described below in steps of various modes. It is noted that known techniques are used for applied voltages to the bit lines BL as well as application method at programming, reading and erasing, and those techniques are omitted in the following description.

(1) Program Operation Mode

Figure 4:
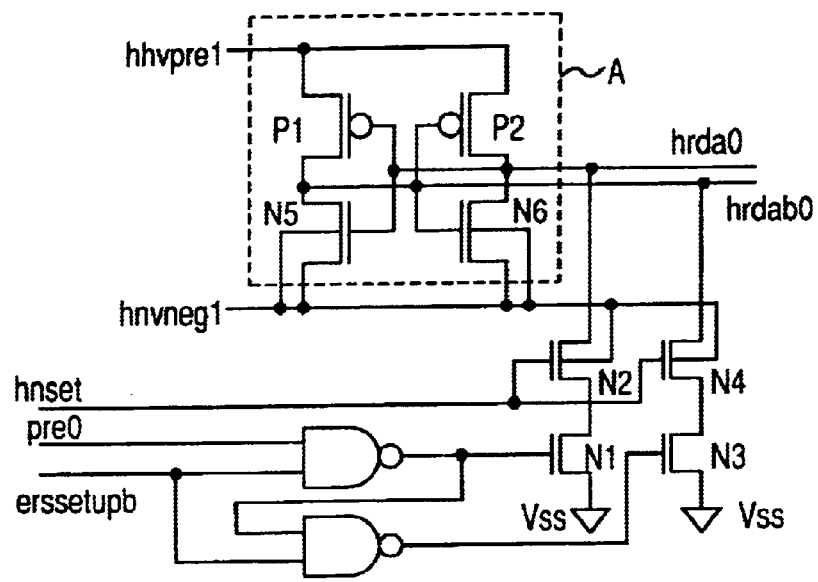
FIG. 4 is a circuit diagram of the control voltage circuit 0 in FIG. 3.
Figure 5:
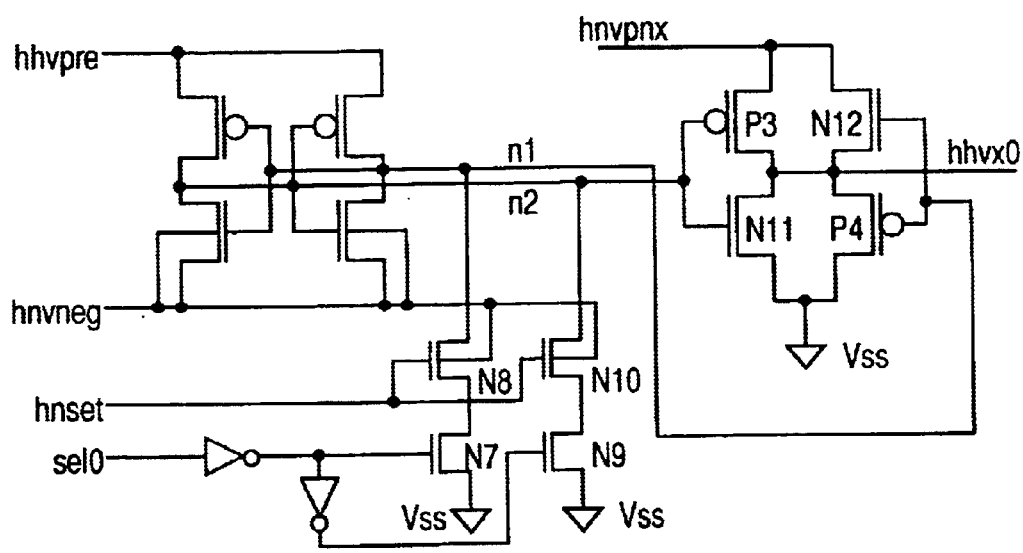
FIG. 5 is a circuit diagram of the select voltage circuit 0 in FIG. 3.
Figure 6:
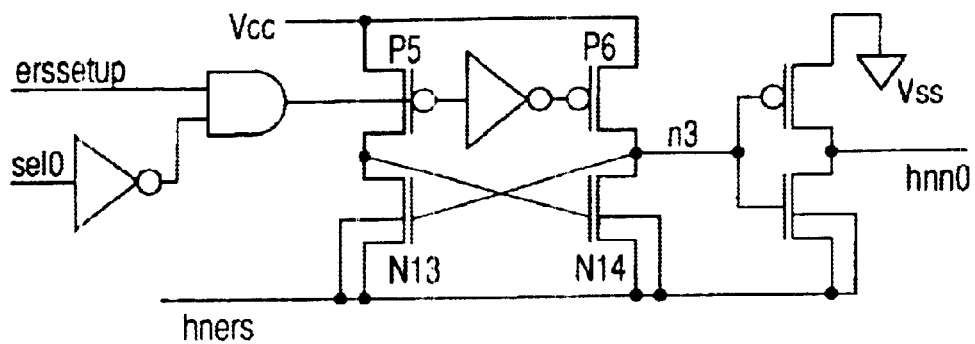
FIG. 6 is a circuit diagram of the non-select voltage circuit 0 in FIG. 3.
Figure 7:
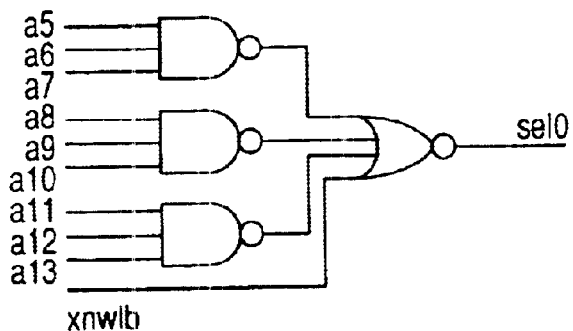
FIG. 7 is a circuit diagram of the block decoder 0 in FIG. 3.
Figure 8:
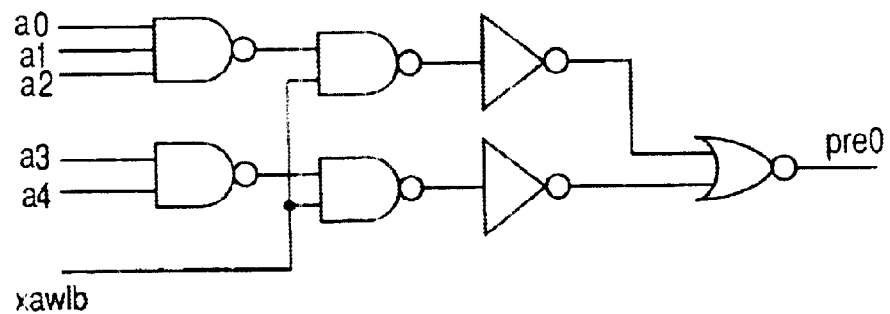
FIG. 8 is a circuit diagram of the predecoder 0 in FIG. 3.
Figure 9:
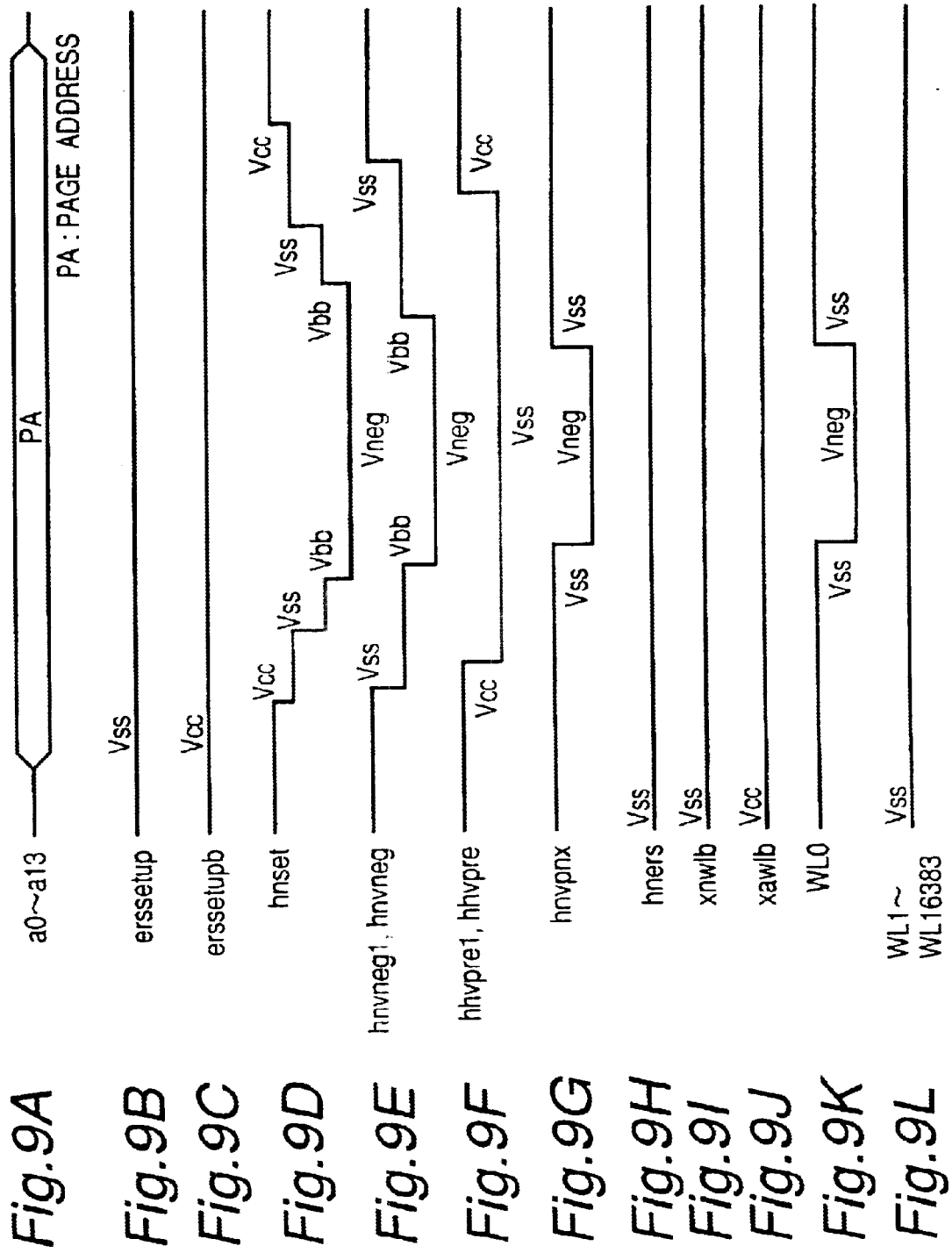
FIGS. 9A–9L are charts showing input and output waveforms for program operation in the row decoder shown in FIG. 3.

First, a case of programming to a memory cell the control gate of which is connected to the word line WL0 is described FIG. 4 shows a circuit diagram of a control voltage circuit 0 forming part of the control voltage circuit section 13. FIG. 5 shows a circuit diagram of a select voltage circuit 0 forming part of the select voltage circuit section 14. FIG. 6 shows a circuit diagram of a non-select voltage circuit 0 forming part of the non-select voltage circuit section 15. FIG. 7 shows a circuit diagram of a block decoder 0 forming part of the block decoder section 17. FIG. 8 shows a circuit diagram of a predecoder 0 forming part of the predecoder section 16. FIGS. 9A–9L show input and output waveforms in the program operation mode, showing a case where the word line WL0 is selected. In addition, the block decoder and the predecoder are known technologies and their detailed description is omitted here.

The control voltage circuit is a circuit which outputs a control signal for opening and closing a P-channel MOS (Metal Oxide Semiconductor) transistor and an N-channel MOS transistor constituting the driver section 12 of the row decoder 11. FIG. 4 shows a circuit construction of the control voltage circuit 0 for the word line WL0, where output signals hrda0 and hrdab0 are generated by inputting an input signal pre0 (output signal of predecoder 0). Input signals other than the input signal pre0 as well as power supply are common to the control voltage circuits i (i=0–31).

The select voltage circuit and the non-select voltage circuit are intended to output an applied voltage to selected or non-select word lines WL. This applied voltage is applied to a relevant word line WL via the driver section 12. FIG. 5 shows a circuit construction of the select voltage circuit 0 for the word lines WL, where an output signal hhvx0 is generated by inputting an input signal se10 (output signal of the block decoder 0). FIG. 6 shows a circuit construction of the non-select voltage circuit 0 for the word line WL0, where an output signal hnn0 is generated by inputting an input signal se10 (output signal of the block decoder 0). Input signals other than the input signal se10 as well as power supply are common to the select voltage circuits j or non-select voltage circuits j (j=0–511).

The output signal hrda0 from the control voltage circuit 0 is inputted to the gate of a P-channel MOS transistor, to the source of which the output signal hnn0 of the non-select voltage circuit 0 is inputted, and to the gate of an N-channel MOS transistor, to the source of which the output signal hhvx0 of the select voltage circuit 0 is inputted. Meanwhile, the output signal hrdab0 from the control voltage circuit 0 is inputted to the gate of a P-channel MOS transistor, to the source of which the output signal hhvx0 of the select voltage circuit 0 is inputted, and to the gate of an N-channel MOS transistor, to the source of which the output signal hnn0 of the non-select voltage circuit 0 is inputted. Then, the two P-channel MOS transistors and the two N-channel MOS transistors constitute a driver for the first word line WL0, where the drains of those transistors are commonly connected to the word line WL0.

Similarly, the output signals hrda0/hrdab0 from the control voltage circuit 0 are connected also to the gates of two P-channel MOS transistors and two N-channel MOS transistors, the drains of which are commonly connected to the word line WL32n, which is the first word line WL of blocks n (n=1–511).

From this onward, likewise, an output signal hrda31 from the control voltage circuit 31 is inputted to the gate of a P-channel MOS transistor, to the source of which the output signal hnn0 of the non-select voltage circuit 0 is inputted, and to the gate of an N-channel MOS transistor, to the source of which the output signal hhvx0 of the select voltage circuit 0 is inputted. Meanwhile, an output signal hrdab31 from the control voltage circuit 31 is inputted to the gate of a P-channel MOS transistor, to the source of which the select voltage circuit 0 of the non-select voltage circuit 0 is inputted, and to the gate of an N-channel MOS transistor, to the source of which the output signal hnn0 of the non-select voltage circuit 0 is inputted. Then, the two P-channel MOS transistors and the two N-channel MOS transistors constitute a driver for the last word line WL31 in the block 0, where the drains of those transistors are commonly connected to the word line WL31.

Similarly, the output signals hrda31/hrdab31 from the control voltage circuit 31 are connected also to the gates of two P-channel MOS transistors and two N-channel MOS transistors, the drains of which are commonly connected to the last word line WL(32n+31) (n=1–511).

As shown in FIG. 9A, when the program operation is started, a page address PA is first set by address signals a0–a13. In this connection, as shown in FIG. 3, address signals a0–a4 are inputted to the predecoder 0–predecoder 31. Then, one predecoder is selected depending on the contents of the address signals a0–a13, so that output signals pre i are activated. Meanwhile, address signals a5–a13 are inputted to the block decoder 0–block decoder 511. Then, one block decoder is selected depending on the contents of the address signals a5–a13, so that output signals sel j are activated.

As shown in FIG. 8, a power supply voltage Vcc (3 V) of level "H" is supplied as a signal xawlb to be inputted to the predecoders i. Meanwhile, as shown in FIG. 7, a power supply Vss (0 V) of level "L" is inputted as a signal xnwlb to be inputted to the block decoders j. As a result, an output signal pre i of level "H", i.e., Vcc (3 V) is outputted from the selected predecoders i. Meanwhile, an output signal pre i of level "L", i.e., Vss (0 V) is outputted from the non-select predecoders i. Also, an output signal sel j of level "H", i.e., Vcc (3 V) is outputted from the selected block decoders j. Meanwhile, an output signal sel j of level "L", i.e., Vss (0 V) is outputted from the non-select block decoders j.

For example, when the word line WL0 of the block 0 is selected, because the input signals a5–a13 of the block decoder 0 of FIG. 7 and the input signals a0–a4 of the predecoder 0 of FIG. 8 are all "H" level, the output signal pre0 of the predecoder 0 and the output signal se10 of the block decoder 0 go "H" level, while the output signals pre1–pre31 of the other predecoders and the output signals sel1–sel511 of the other block decoders go "L" level.

Then, the input signal pre0 (="H" (Vcc)) is inputted to the control voltage circuit 0. Also, a signal erssetupb (inverted signal of erssetup) of level "H" (Vcc) is inputted. Further, the level of an input signal hnset is "H" (Vcc) at first. As a result of this, the N-channel MOS transistors N2, N3, N4 in the control voltage circuit 0 are turned on, while the N-channel MOS transistor N1 is turned off. It is noted that, in particular, the p-wells of the N-channel MOS transistors N2, N4, N5, N6 are connected to a power supply hnvneg1 which is switchable between Vcc and Vss.

Therefore, because the power supply hhvpre1 is set to Vcc and the power supply hnvneg1 is set to Vss at first so that the N-channel MOS transistors N3, N4 are turned on, the output signal hrdab0 is pulled up to Vss. As a result, the P-channel MOS transistor P2 is turned on, causing the N-channel MOS transistor N5 to turn on as well. Thus, by a latch circuit A composed of the two P-channel MOS transistors P1, P2 and the two N-channel MOS transistors N5, N6, the output signal hrdab0 is outputted while latched to "L" level, and the output signal hrda0 is outputted while latched to "H" level. In this operation, the power supply hhvpre1 is the same value as hhvpre and the power supply hnvneg1 is the same value as hnvneg.

As a result, the driver for the word line WL0 is made up, so that P-channel MOS transistors and N-channel MOS transistors to the sources of which the output signal hhvx0 of the select voltage circuit 0 is inputted are turned on. Meanwhile, P-channel MOS transistors and N-channel MOS transistors to the sources of which the output signal hnn0 of the non-select voltage circuit 0 is inputted are turned off.

In this connection, the applied voltage to the word line WL0 is changed from Vss to Vneg (−8 V) for programming by the row decoder as shown in FIG. 9K, the individual power supply voltages and the levels of the control signals are converted. The level conversion in this case is effected at a timing which will be detailed later so that the voltage to be applied across the transistors is prevented from increasing, and that malfunctions (level changes of the output signal hrda0 and the output signal hrdab0 of the control voltage circuit 0) are prevented, thus making it possible to use transistors of lower withstand voltage. The level conversion of power supply voltage and control signal level is described in detail below.

First, the level of an input signal hnset is changed from Vcc to Vss as shown in FIG. 9D. As a result, whereas the N-channel MOS transistors N2, N4 are turned off, the latch circuit A is in a latched state so that no changes occur to the output signal hrda0 and the output signal hrdab0.

Subsequently, the power supply hnvneg1 is changed from Vss to Vbb (where Vbb is a voltage value between Vss and Vneg (e.g., −4 V)), and thereafter the power supply hhvpre1 is dropped from Vcc to Vss. Since the lower power supply hnvneg1 is first dropped like this, the state of the latch circuit A remains unchanged.

Subsequently, the level of the input signal hnset is changed from Vss to Vbb so that the applied voltage across the transistors is further reduced. During this operation, the relationship between the level "H" of the output signal hrda0 and the level "L" of the output signal hrdab0 holds unchanged. Further, the level of the input signal hnset is changed from Vbb to Vneg (e.g., −8 V). In this case also, since the N-channel MOS transistors N2, N4 hold off, the relationship between the level "H" of the output signal hrda0 and the level "L" of the output signal hrdab0 is maintained as it is.

Subsequently, the level of the power supply nvneg1 is first lowered from Vbb to Vneg. As a result, the output signal hrda0 is held at "H" level and the output signal hrdab0 is held at "L" level, with the result that the voltage of "H" has been converted from Vcc to Vss while the voltage of "L" has been converted from Vss, via Vbb, to Vneg (which is the level of the voltage to be applied to control gates of memory cells at programming).

Meanwhile, in the control voltage circuits 1–31, the input signals pre1–pre31 are at "L" (Vss) level and the input signal hnset is at "H" (Vcc) level at first, so that the N-channel MOS transistors N1, N2, N4 are turned on and the N-channel MOS transistor N3 is turned off. Therefore, the output signals hrda1–hrda31 are pulled in to Vss, so that the P-channel MOS transistor P1 is turned on unlike the case of the control voltage circuit 0 as described above. As a result of this, the N-channel MOS transistor N6 is turned on, so that the latch circuit A latches the output signals hrda1–hrda31 in the "L" level state and the output signals hrdab1–hrdab31 in the "H" level state.

In the case where the applied voltage of the word line WL0 is changed from Vss to Vneg (−8 V) for programming by the row decoder 11, the levels of the various power supply voltages and the control signals are changed as in the case of the control voltage circuit 0 as described above.

Next, operation of the select voltage circuit is described. The constitution of up to nodes n1, n2 in the select voltage circuit is generally similar to that of the control voltage circuit. Then, when the input signal se10 to the select voltage circuit 0 is at "H" (Vcc) level, the N-channel MOS transistors N8, N9, N10 are turned on, so that the node n1 is held in the "H" level state and the node n2 is held in the "L" level state.

In this case, since the input signals sel1–sel511 to be inputted to the select voltage circuits 1–511 are at "L" (Vss) level, the N-channel MOS transistors N7, N8, N10 are turned on in the select voltage circuits 1–511. Therefore, the node n1 is held in the "L" level state and the node n2 is held in the "H" level state.

In the case where the applied voltage to the word line WL0 is changed from Vss to Vneg (−8 V) for programming by the row decoder 11, the levels of the various power supply voltages and the control signals are changed while the level states held by the select voltage circuits are maintained, as in the case of the control voltage circuit as described above. That is, the voltage of level "H" is converted from Vcc to Vss, and the voltage of the level "L" is converted from Vss via Vbb to Vneg, at the timing shown in FIG. 9.

Then, the nodes n2 in the select voltage circuits are connected commonly to the gate of the P-channel MOS transistor P3 the source of which is connected to a power supply hnvpnx, and to the gate of the N-channel MOS transistor N11 the source of which is connected to the In power supply Vss (0 V). Meanwhile, the node n1 is connected commonly to the gate of the P-channel MOS transistor P4 the source of which is connected to the power supply Vss, and to the gate of the N-channel MOS transistor N12 the source of which is connected to the power supply hnvpnx. It is noted that the drains of the two P-channel MOS transistors P3, P4 and the two N-channel MOS transistors N11, N12 are commonly connected to each other, serving as output terminals for the output signal hhvx.

After the level "L" of the node n1 or node n2 is changed to Vneg (−8 V), the level of the power supply hnvpnx is changed from Vss (0 V) to Vneg (−8 V). As a result, in the select voltage circuit 0 (se10="H"), at first, if the power supply hnvpnx is Vss, the output signal hhvx0 of Vss is outputted. However, if the power supply hnvpnx is changed to Vneg, the N-channel MOS transistor N12 is turned on, so that the output signal hhvx0 becomes Vneg.

In contrast to this, in the case of the select voltage circuits 1–511 (sel1–sel511="L"), at first, if the power supply hnvpnx is Vss, the output signal hhvx0 of Vss is outputted. However, even if the power supply hnvpnx is changed to Vneg, the P-channel MOS transistor P4 is turned on so that the output signal hhvx0 is unchanged as it is Vss.

Next, operation of the non-select voltage circuit is described. In the non-select voltage circuit, because the input signal erssetup is at "L" (Vss) level, a P-channel MOS transistor P5 is turned on regardless of the level of the input signals sel in the non-select voltage circuits 0–511, causing the N-channel MOS transistor N14 to be turned on. Therefore, the node n3 goes "L" level (=power supply hners (Vss)), with the result that the output signals hnn0–hnn511 are normally set to Vss.

The signals and voltages set in this way, derived from the control voltage circuits 0–31, the select voltage circuits 0–511 and the non-select voltage circuits 0–511, are inputted to the driver section 12. Then, the applied voltage to the word line WL0 (where the input signal pre0 of the control voltage circuit 0 and the input signal se10 of the select voltage circuit 0 are at "H" level) is set as follows.

That is, the output signal hrda0 of the control voltage circuit 0 is at "H" level (=power supply hhvpre (Vss at the time point when the power supply hnvpnx is Vneg)), and the output signal hrdab0 is at "L" level (=power supply hnvneg (Vneg at the time point when the power supply hnvpnx is Vneg). Also, the output signal hhvx0 of the select voltage circuit 0 is changed from Vss to Vneg together with the level change of the power supply hnvpnx. Also, the output signal hnn0 of the non-select voltage circuit 0 holds Vss. From these facts, Vss is first outputted to the word lines WL0. Then, when the output signal hhvx0 is changed to Vneg at programming, the N-channel MOS transistor N15 is turned on, so that Vneg is outputted.

Next, the applied voltage to the non-select word line WL31 (where the level of the input signal pre31 of the control voltage circuit 31 is "L" and the level of the input signal se10 of the select voltage circuit 0 is "H") is set as follows. That is, the output signal hrda31 of the control voltage circuit 31 is at "L" level (=power supply hnvneg (Vneg at the time point when the power supply hnvpnx is Vneg)), and the output signal hrdab31 is at "H" level (=power supply hhvpre (Vss at the time point when the power supply hnvpnx is Vneg)). Further, the output signal hhvx0 of the select voltage circuit 0 is changed from Vss to Vneg as described above. Also, the output signal hnn0 of the non-select voltage circuit 0 holds Vss. From these facts, Vss is first outputted to the non-select word line WL31. Then, when the output signal hhvx0 is changed to Vneg at programming, the P-channel MOS transistor P7 is turned on, so that Vss (hnn0) is outputted and held.

Next, the applied voltage to the non-select word line WL16352 (where the input signal pre0 of the control voltage circuit 0 is at "H" level and the input signal sel511 of the select voltage circuit 511 is at "L" level) is set as follows. That is, the output signal hrda0 of the control voltage circuit 0 is at "H" level, and the output signal hrdab0 is at "L" level. Also, the output signal hhvx511 of the select voltage circuit 511 is Vss and the output signal hnn511 of the non-select voltage circuit 511 is Vss as well, so that Vss is outputted to the non-select word line WL16352.

Finally, the applied voltage to the non-select word line WL16383 (where the input signal pre31 of the control voltage circuit 31 and the input signal sel511 of the select voltage circuit 511 are at "L" level) is set as follows. That is, the output signal hrda31 of the control voltage circuit 31 is at "L" level, and the output signal hrdab31 is at "H" level. Also, the output signal hhvx511 of the select voltage circuit 511 is Vss and the output signal hnn511 of the non-select voltage circuit 511 is Vss as well, so that Vss is outputted to the non-select word line WL16383.

As shown above, outputs to the select word lines or the non-select word lines are summarized to the above four cases. These are listed below collectively in Table 3.

TABLE 3

Output signals of row decoder at programming (where power supply hnvpnx is Vneg)

| | | Output of control voltage circuit | | Select voltage circuit | Non-select voltage circuit | Output voltage to word line WL |
|---|---|---|---|---|---|---|
| pre | sel | hrda | hrdab | hhvx | hnn | |
| L | L | L | H | Vss | Vss | Vss |
| L | H | L | H | Vss → Vneg | Vss | Vss |
| H | L | H | L | Vss | Vss | Vss |
| H | H | H | L | Vss → Vneg | Vss | Vss → Vneg |

As a result, Vneg is applied to the select word line WL0 and Vss is applied to the word lines WL1–WL16383.

As shown in Table 3, simultaneously when the voltage is applied from the row decoder 11 to the word lines WL, a voltage Vprg (e.g., 5 V) is applied to the drains of memory cells to be programmed via the main bit lines BL and moreover their sources are put into the floating state. By so doing, electrons are pulled out from the floating gate by the FN tunneling phenomenon, so that the threshold of the memory cells lower to 2 V or lower, thus the program operation being ended.

Thereafter, the power supply hnvpnx is returned from Vneg to Vss, so that the output to the selected word line WL0 is returned from Vneg to Vss, by which the power supply hhvpre, the power supply hnvneg and the input signal hnset are returned to the original state at the timings reverse to those for the start of programming. In this way, the internal state remains unchanged even if the applied voltage is changed.

(2) Read Operation Mode

In this case also, a case of reading out a memory cell the control gate of which is connected to the word line WL0 is described. Input and output waveforms to the row decoder 11 in this case are shown in FIGS. 10A–10L.

Figure 10:
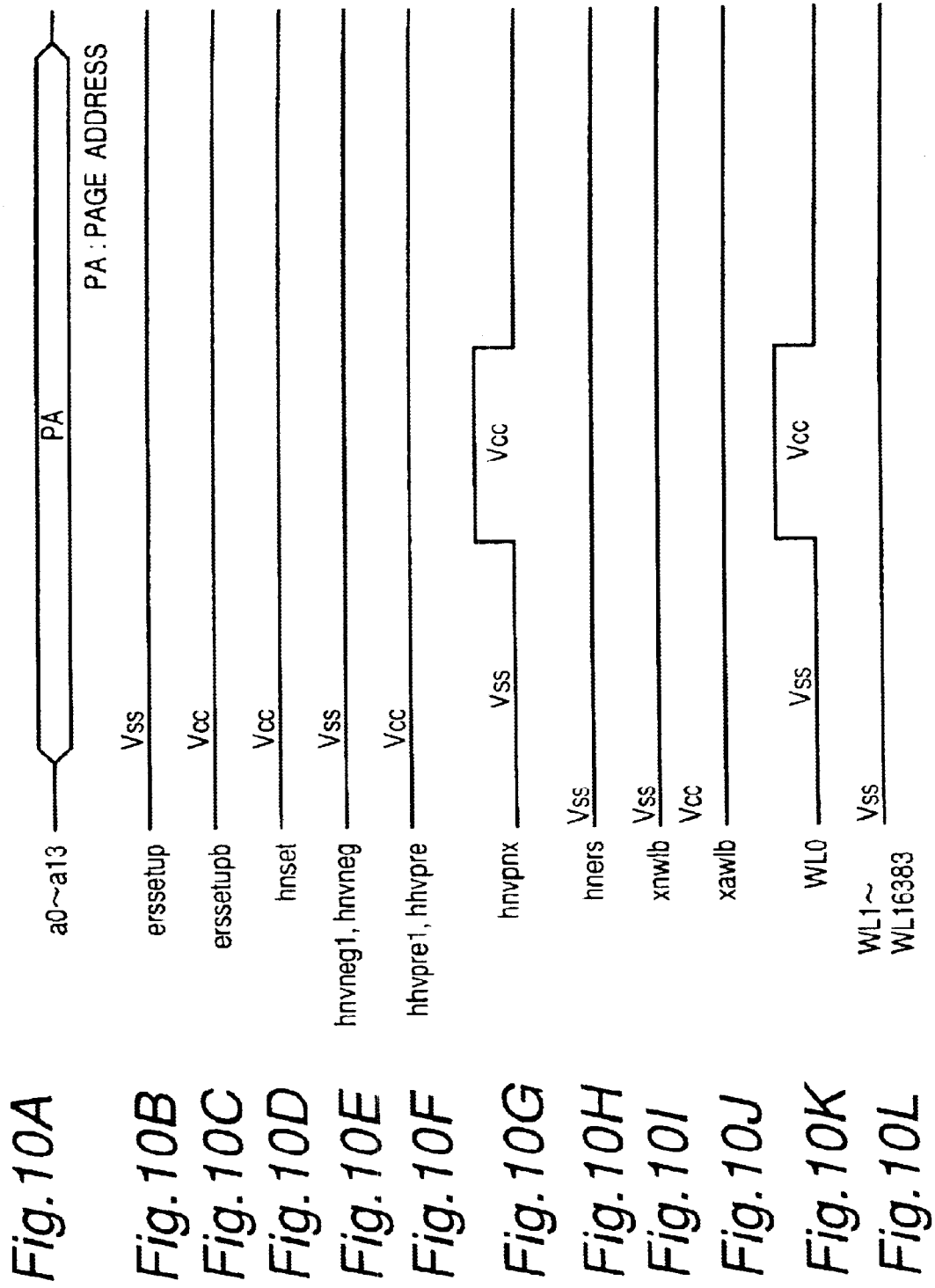
FIGS. 10A–10L are charts showing input and output waveforms for read operation in the row decoder shown in FIG. 3.
Figure 11:
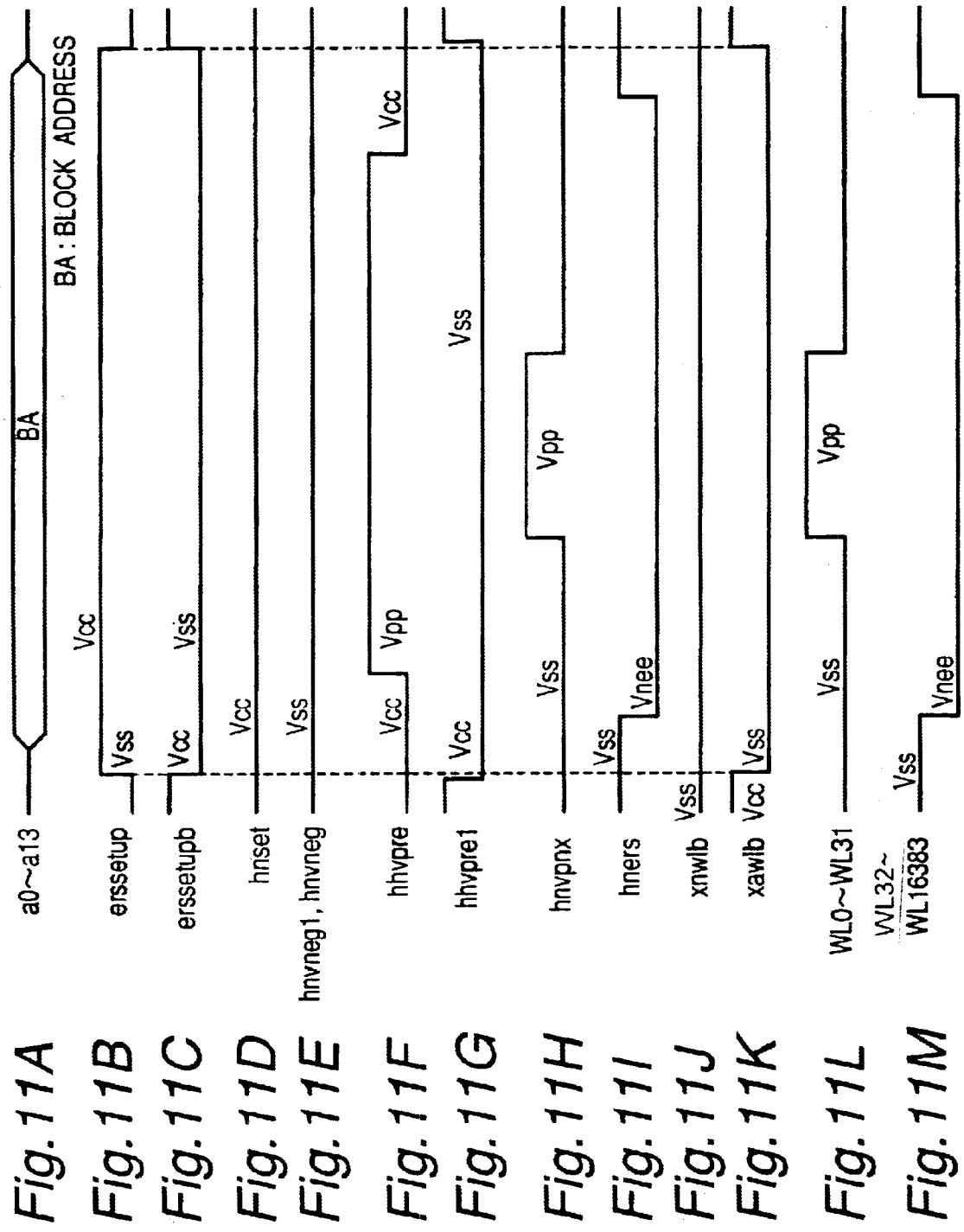
FIGS. 11A–11M are charts showing input and output waveforms for erase operation in the row decoder shown in FIG. 3.

As shown in FIGS. 10A–10L, when a read operation is started, the page address PA is first set by addresses a0–a13 as shown in FIG. 10A. Settings of the signals pre and signals sel within the row decoder 11 are the same as in the foregoing program operation. In this embodiment, since the word line WL0 is selected, the signal pre0 and the signal sel0 become "H" (Vcc) level, while the other signals pre1–pre31 and signals sel1–sel511 become "L" (Vss) level.

Meanwhile, the signal erssetup is set to Vss, the input signal erssetupb is set to Vcc, the signal xnwlb is set to Vss, the signal xawlb is set to Vcc, and the power supply hners is set to Vss. These settings are similar to those for the foregoing program operation. Also, the input signal hnset is set to Vcc, the power supply hnvneg is set to Vss, and the power supply hhvpre is set to Vcc. In read operation, the power supply hnvneg1 and the power supply hhvpre1 are equal in value to hnvneg and hhvpre, respectively. This is the same as in the foregoing program operation. It is noted that in the program operation, level change is effected after this in view of withstand voltage so that Vneg is outputted.

Therefore, the control voltage circuit section 13, the select voltage circuit section 14, the non-select voltage circuit section 15 and the driver section 12 are similar in operation to those of the program operation in its initial state. As a result, outputs to the select word line WL0 and the non-select word lines WL1–WL16383 are the same as in Table 3, although the level of output voltages are different. Output states to the select word line WL0 and the non-select word lines WL1–WL16383 in read operation are shown in Table 4.

TABLE 4

Output signals of row decoder at reading (where power supply hnvpnx is Vcc)

| | | Output of control voltage circuit | | Select voltage circuit | Non-select voltage circuit | Output voltage to word line WL |
|---|---|---|---|---|---|---|
| pre | sel | hrda | hrdab | hhvx | hnn | |
| L | L | L | H | Vss | Vss | Vss |
| L | H | L | H | Vss → Vcc | Vss | Vss |
| H | L | H | L | Vss | Vss | Vss |
| H | H | H | L | Vss → Vcc | Vss | Vss → Vcc |

As a result, a power supply hhvpnx (which changes from Vss to Vcc after the address is established) is outputted to a selected word line WL0 (in Table 4, (pre, sel)=(H, H)). Then, Vcc (e.g., 3 V) is applied to the selected word line WL0, by which memory cells the control gates of which are connected to this selected word line WL0 become readable.

Then, 0 V is applied to main bit lines BL0 connected to the sources of the memory cells to be read, while 1 V is applied to main bit lines BL connected the drains of the memory cells. After that, a current flowing through the main bit lines BL connected to the drains is sensed by a sense circuit (not shown), thus allowing the data held in the memory cell to be read.

Meanwhile, since Vss is outputted to the non-select word lines WL1–WL16383, memory cells the control gates of which are connected to these non-select word lines WL1–WL16383 are not read.

(3) Erase Operation Mode

Erase operation is performed on the block-by-block basis as described above. In this case, a case in which a block 0 (i.e., memory cells to the control gates of which the word lines WL0–WL31 are connected) is erased is described. Input and output waveforms of the row decoder 11 are shown in FIGS. 11A–11M.

First, the level of an erase set signal erssetup is raised from "L" (Vss) to "E" (Vcc). When this occurs, the level of an inverted signal erssetupb falls from "H" (Vcc) to "L" (Vss), conversely.

Further, for execution of block-by-block operation, the level of a signal xawlb is lowered from "H" (Vcc) to "L" (Vss). As a result, output of every predecoder i becomes pre i="H" (Vcc) regardless of the address signals a0–a4, thus resulting in the block-by-block operation. In contrast to this, the level of the signal xnwlb remains "L" (Vss) as in the program and read operations. Also, the signal hnset is set to Vcc, and the power supply hnvneg (in erase operation, hnvneg1 is of the same value as the hnvneg) is set to Vss. Also, power supply hhvpre and power supply hhvpre1 are first set to Vcc. Then, after the power supply hners has changed in level from Vss to Vnee, only the power supply hhvpre is raised from Vcc to Vpp. Meanwhile, the power supply hhvpre1 is lowered from Vcc to Vss before the inverted signal erssetupb erase set signal lowers from Vcc to Vss.

As shown in FIGS. 11A–11M, when the erase operation starts up, the address signals a0–a13 are inputted to the predecoders and the block decoders as in the case of program and read operations. Then, a block address BA is set. Since the level of the signal xawlb is at "L", the output signals pre0–pre31 of all the predecoders go "H" regardless of the values of the addresses a0–a4. Therefore, since the output signal se10 of the block decoder 0 has come to "H" level, it means that the block 0 has been selected. That is, the row decoder 11 operates on the block-by-block basis, and according to the addresses a5–a13.

First, operation of the control voltage circuit is described. Since the inverted signal erssetupb of the erase set signal becomes "L" (Vss), the N-channel MOS transistors N1, N3 of the control voltage circuit 0–control voltage circuit 31 are turned on. Also, since the level of the input signal hnset is at "H" (Vcc), the N-channel MOS transistors N2, N4 are also turned on. Therefore, both the output signals hrda0–hrda31 and the output signals hrdab0–output signal 31 are pulled by Vss so as to go "L" level. It is noted that the power supply hhvpre1 and the power supply hnvneg1 have been lowered to Vss as described above, there are no problems in terms of circuits.

Subsequently, the select voltage circuit is described. Since the level of the input signal hnset is at "H" (Vcc), the N-channel MOS transistors N8, N9, N10 are turned on so that the node n2 is pulled to Vss in the select voltage circuit 0 (input signal sel="H" (Vcc)). Meanwhile, in the select voltage circuit 1–select voltage circuit 511 (input signal sel="L" (Vss)), the N-channel MOS transistors N7, N8, N10 are turned on so that the node n1 is pulled up to Vss.

That is, as described in the above program operation, in a select voltage circuit to which the input signal sel="H" (Vcc) is inputted, the level of the node n1 is fixed to "H" (=power supply hhvpre (Vcc at the beginning)) and the level of the node n2 is fixed to "L" (=power supply hnvneg (Vss)). Meanwhile, in the select voltage circuits to which the input signal sel="L" (Vss) is inputted, the level of the node n1 is fixed to "L" (=power supply hnvneg (Vss)) and the level of the node n2 is fixed to "H" (=power supply hhvpre (Vcc at the beginning)), conversely.

Next, the power supply hhvpre rises from Vcc to Vpp, and then the power supply hnvpnx rises from Vss to Vpp. The period during which this power supply hnvpnx holds Vpp is a period during which the erase voltage is applied to word lines WL connected to the control gates of the memory cells to be erased. Therefore, the output signal hhvx0 of the select voltage circuit 0 (select block) becomes Vss when the power supply hnvpnx is Vss, and with the power supply hnvpnx rising to Vpp, is changed to Vpp by the P-channel MOS transistor P3 that has been turned on. Meanwhile, the output signals hhvx1–hhvx511 of the select voltage circuits 1–511 (non-select block) is Vss when the power supply hnvpnx is Vss, and even with the power supply hnvpnx rising to Vpp, is held Vss by the N-channel MOS transistor N11 that has been turned on, thus remaining unchanged.

Next, operation of the non-select voltage circuit is described. Since the level of the erase set signal erssetup is at "H" (Vcc), the P-channel MOS transistor P5 is turned on in the non-select voltage circuit 0 (select block) to which the input signal se10="H" (Vcc) is inputted, and therefore the N-channel MOS transistor N14 is also turned on. As a result, the power supply hners (Vss→Vnee) is outputted and latched to the node n3, so that the output signal hnn0 goes Vss. Meanwhile, in the non-select voltage circuit 1–non-select voltage circuit 1511 (non-select block) to which the input signals sel1–sel511="L" (Vss) are inputted, the P-channel MOS transistor P6 is turned on, so that the N-channel MOS transistor N13 is also turned on. As a result, Vcc is outputted to the node n3, so that the output signals hnn1–hnn511 go power supply hners (Vss→Vnee). In this case, the power supply hners is Vss at the beginning and lowers to Vnee later.

The individual signals set as described above are inputted to the driver section 12 of the row decoder 11. In this case, both the input signals hrda0–hrda31 and the output signals hrdab0–hrdab31 of all the control voltage circuits are Vss. Then, at the beginning, the power supply hners is Vss and the power supply hnvpnx is Vss.

In this connection, the output signal hhvx0 of the select voltage circuit 0 associated with the select block 0 is Vss because the power supply hnvpnx is Vss. Also, the output signal hnno of the non-select voltage circuit 0 is Vss. Meanwhile, the output signals hhvx1–hhvx511 of the select voltage circuit 1–select voltage circuit 511 associated with the non-select block 1–non-select block 511 are Vss. Also, the output signals hnn1–hnn511 of the non-select voltage circuit 1–non-select voltage circuit 511 are Vss because the power supply hners is Vss. Therefore, first, Vss is outputted to all the word lines WL0–WL16383 via the driver section 12.

Subsequently, the power supply hners falls from Vss to Vnee (e.g., −8 V). As a result of this, the output signals hnn1–hnn511 of the non-select voltage circuit 1–non-select voltage circuit 511 associated with the non-select block go Vnee. In addition, the output signals hhvx1–hhvx511 of the select voltage circuit 1–select voltage circuit 511 associated with the non-select block remain Vss. Then, because all of the output signals hrda and the output signals hrdab of all the control voltage circuits are Vss, N-channel MOS transistors the sources of which are connected to the non-select voltage circuits of the individual drivers associated with the non-select block are turned on. As a result, Vnee is outputted to the word lines WL32–WL16383.

Meanwhile, the output signal hnn0 of the non-select voltage circuit 0 associated with the select block remains Vss because the se10 is at "H" level. In addition, the output signal hhvx0 of the select voltage circuit 0 associated with the select block remains Vss. Therefore, Vss is applied to the select word lines WL0–WL31.

Subsequently, the power supply hhvpnx rises from Vss to Vpp (e.g., 10 V). Then, the output signal hhvx0 of the select voltage circuit 0 associated with the select block changes from Vss to Vpp, so that P-channel MOS transistors the sources of which are connected to the select voltage circuits 0 of the drivers associated with the select block 0 are turned on As a result, the output to the select word lines WL0–WL31 changes from Vss to Vpp.

Meanwhile, the output signals hnn1–hnn511 of the non-select voltage circuit 1–non-select voltage circuit 511 associated with the non-select block remain Vnee because the output signals sel1–sel511 are at "L" level.

Then, upon completion of the erase of memory cells the control gates of which are connected to the word lines WL of the select block, the power supply hnvpnx is first returned from Vpp to Vss, conversely to the above procedure. As a result, the voltage of the word lines WL0–WL31 that have executed the erase operation returns from Vpp to Vss. Next, the power supply hhvpre is returned from Vpp to Vcc, and further the power supply hners is returned from Vnee to Vss.

As a result, the voltage of the non-select word lines WL32–WL16383 returns from Vnee to Vss. Thereafter, the level of the signal xawlb is returned from "L" (Vss) to "H" (Vcc), the level of the signal erssetup is returned from "H" (Vcc) to "L" (Vss), and then the power supply hhvpre1 is returned from Vss to Vcc.

Input/output signals of the individual circuits of the row decoder 11 as well as output voltages to the word lines WL during the erase operation described above are listed in Table 5:

TABLE 5

Output signals of row decoder at erasing (where power supply hnvpnx is Vpp)

| pre | sel | Output of control voltage circuit hrda | Select voltage circuit hrdab | Non-select voltage circuit hhvx | | Output voltage to word line WL |
|-----|-----|------|-------|-------------|-----|-------------|
| H | L | Vss | Vss | Vss | Vss → Vnee | Vss → Vnee |
| H | H | Vss | Vss | Vss → Vpp | Vss | Vss → Vpp |

In Table 5, the notation of input signal sel="H" represents a select block, and the notation of input signal sel="L" represents a non-select block.

By the operation of the row decoder 11 as described above, Vpp is applied to the word lines WL0–WL31 of the select block 0. Further, Vnee is applied to the drains and sources of memory cells and to the substrate (well) within the memory cell array via the main bit lines BL. By so doing, in the memory cells within the select block 0, electrons are injected to the floating gates from the channel layer by the FN tunneling phenomenon, causing the threshold of the memory cells to rise, where when the threshold value becomes 4 V or more, the erase operation ends.

Meanwhile, in the non-select block 1–non-select block 511, Vnee is applied to the word lines WL32–WL16383. On the other hand, Vnee is applied to the main bit lines BL and the substrate (well), which are common to the main bit lines BL and the substrate (well) within the select block 0. Therefore, in the non-select block 1–non-select block 511, the same voltage Vnee is applied to the control gate, drain, source and substrate (well) of each memory cell, thus the non-select blocks being free from any substrate disturb during erasing.

As a result, by virtue of using the row decoder 11, as shown in FIG. 2, even if a total of disturb time exceeds $10^6$ sec, there is almost no fluctuation of threshold voltage Vt even with memory cells of low threshold value (in programmed state) which are liable to be affected by the substrate disturb at erasing. This makes it possible to realize a nonvolatile semiconductor storage device which is free from occurrence of mis-reads and high in reliability. Further, since the word lines WL of a non-select block are equal in voltage to the substrate (well), the capacity involved in erasing can be reduced, so that the layout area of the charge pump can be reduced.

Second Embodiment

Figure 12:
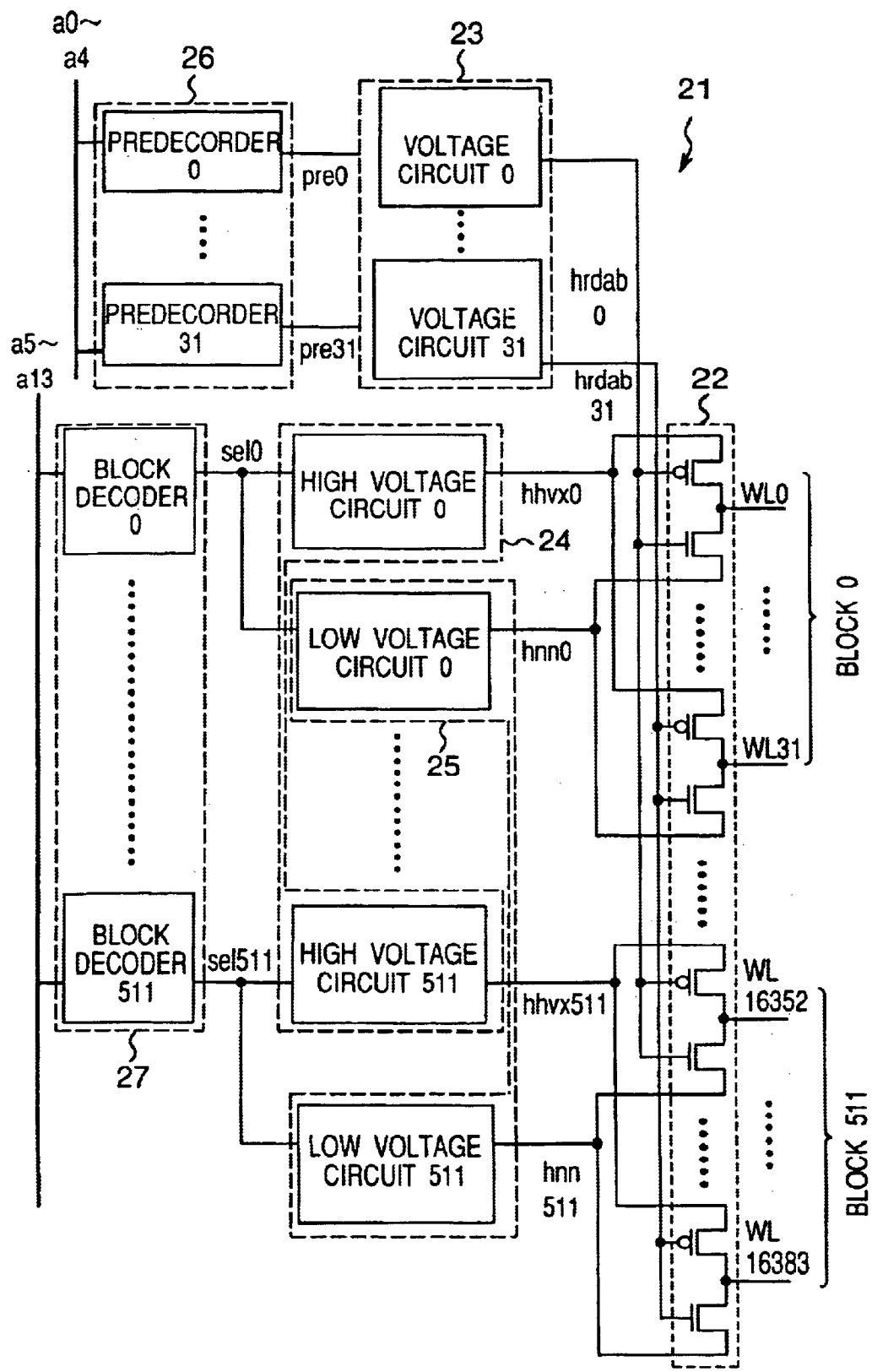
FIG. 12 is a block diagram of a row decoder different from that of FIG. 3.

FIG. 12 shows a block diagram of a row decoder according to this embodiment. In this embodiment, drivers which are connected to individual word lines WL to make up a driver section 22 of the row decoder 21 are implemented each by two transistors, a P-channel MOS transistor and an N-channel MOS transistor. Thus, the area occupied by each driver is largely reduced.

On this account, in place of the select voltage circuit section 14 and the non-select voltage circuit section 15 in the first embodiment, a high voltage circuit section 24 and a low voltage circuit section 25 are provided. Also, a predecoder section 26 and a block decoder section 27 have constitutions similar to those of the predecoder section 16 and the block decoder section 17 in the first embodiment. Further, a signal prgsetup and a signal wlon as well as a power supply hnvnnx and a power supply hhvpp are newly provided.

Figure 13:
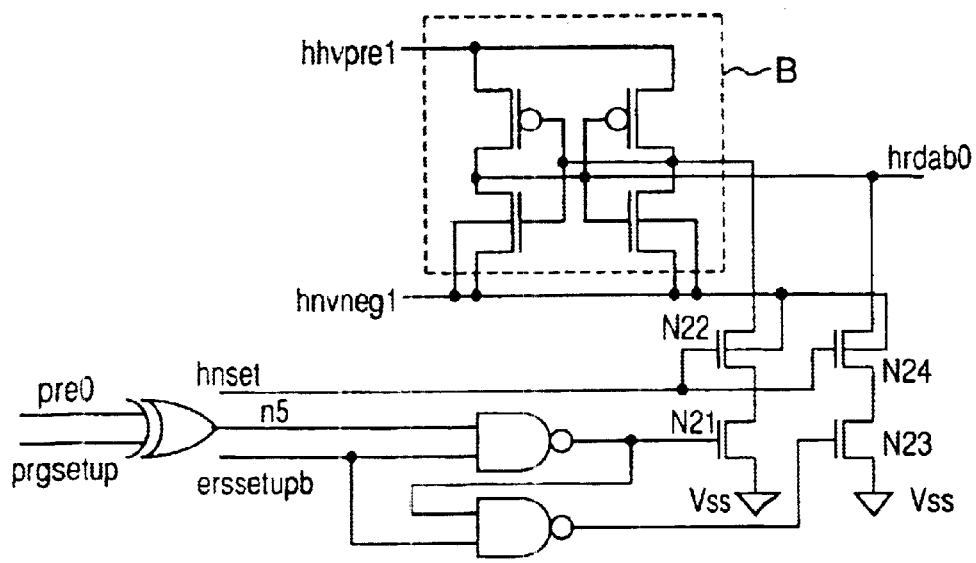
FIG. 13 is a circuit diagram of the control voltage circuit 0 in FIG. 12.
Figure 14:
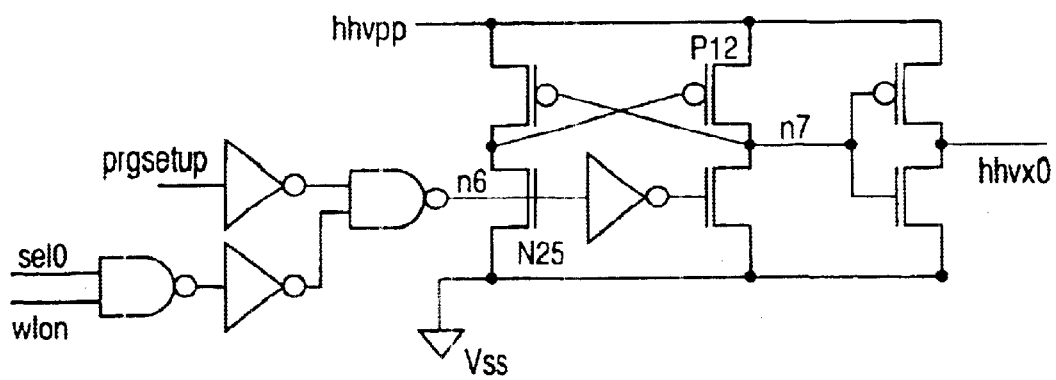
FIG. 14 is a circuit diagram of the high voltage circuit 0 in FIG. 12.
Figure 15:
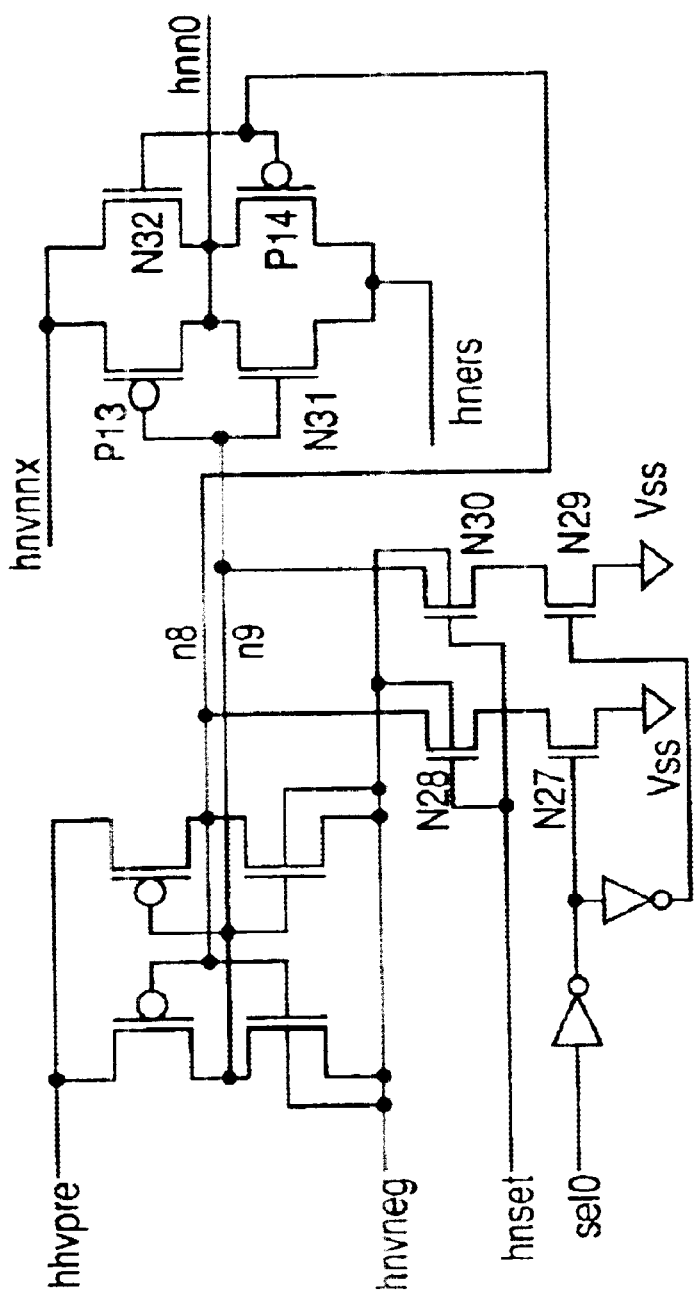
FIG. 15 is a circuit diagram of the low voltage circuit 0 in FIG. 12.

In this connection, FIG. 13 shows a circuit diagram of a control voltage circuit 0 forming part of a control voltage circuit section 23. FIG. 14 shows a circuit diagram of a high voltage circuit 0 forming part of the high voltage circuit section 24. FIG. 15 shows a circuit diagram of a low voltage circuit 0 forming part of the low voltage circuit section 25. It is noted that the circuit construction of the predecoder 0 forming part of the predecoder section 26 is similar to FIG. 8. Also, the circuit construction of the block decoder 0 forming part of the block decoder section 27 is similar to FIG. 7. Further, input/output waveforms for the row decoder 21 at individual operations are shown in FIGS. 16A–16O to 18A–18Q. It is noted that the high voltage circuit section 24 and the low voltage circuit section 25 produce applied voltages to the select or non-select word lines WL via the driver section 22.

FIG. 13 shows the circuit construction of the control voltage circuit 0, which receives an input signal pre0 and produces an output signal hrdab0. Input signals and power supplies other than the input signal pre0 are common to individual control voltage circuits i (i=0–31). FIGS. 14 and 15 show circuit constructions of the high voltage circuit 0 and the low voltage circuit 0, which receive an input signal sel0 and produce an output signal hhvx0 or an output signal hnn0. Input signals and power supplies other than the input signal sel0 are common to individual high voltage circuits j (j=0–511).

The output signal hrdab0 from the control voltage circuit 0 is inputted to the gate of the P-channel MOS transistor, to the source of which the output signal hhvx0 of the high voltage circuit 0 is inputted, as well as to the gate of the N-channel MOS transistor, to the source of which the output signal hnno of the low voltage circuit 0 is inputted. These two transistors constitute a driver for the first word line WL0 of the block 1, and their drains are commonly connected to word line WL0.

Similarly, the output signal hrdab0 from the control voltage circuit 0 is connected also to the gates of the P-channel MOS transistor and the N-channel MOS transistor, the drains of which are commonly connected to the first word line WL32n (n=1–511) of the block n.

Likewise after this on, the output signal hrdab31 from the control voltage circuit 31 is connected to the gate of the P-channel MOS transistor, to the source of which the output signal hhvx0 of the high voltage circuit 0 is inputted, as well as to the gate of the N-channel MOS transistor, to the source of which the output signal hnn0 of the low voltage circuit 0 is inputted. Then, these two transistors constitute the driver for the last word line WL31 of the block 1, and their drains are commonly connected to the word line WL31.

Similarly, the output signal hrdab31 from the control voltage circuit 31 is connected also to the gates of the P-channel MOS transistor and the N-channel MOS transistor, the drains of which are commonly connected to the last word line WL(32n+31) (n=1–511) of the block n.

Memory structure of the flash memory driven by the row decoder 21 of this embodiment is similar to that of the first embodiment. Hereinbelow, operation of the row decoder 21 at programming, reading and erasing in this embodiment is described.

(1) Program Operation Mode

Figure 16:
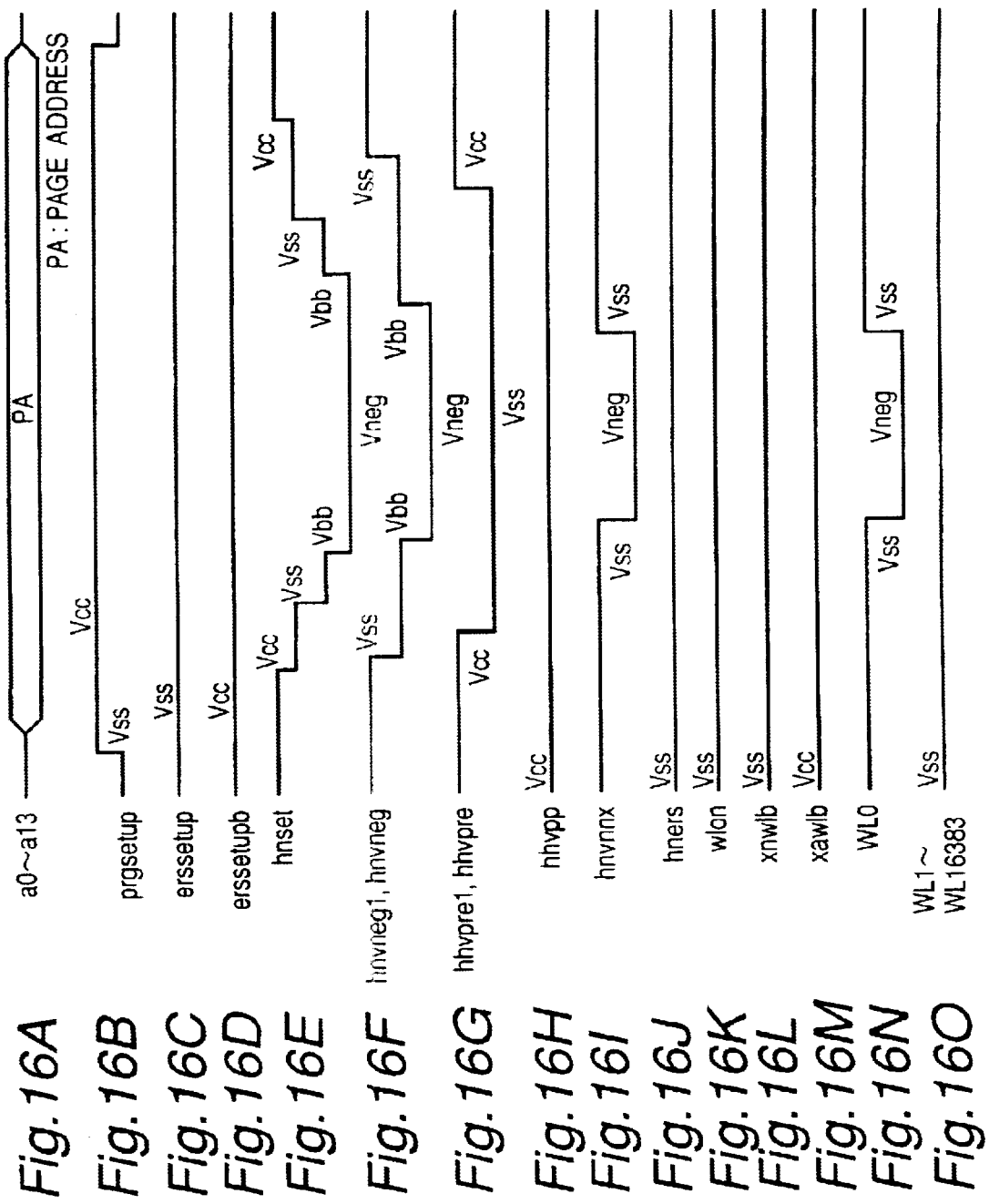
FIGS. 16A–16O are charts showing input and output waveforms for program operation in the row decoder shown in FIG. 12.

A case of programming to a memory cell the control gate of which is connected to the word line WL0 is described here. When the program operation is started, the level of the signal prgsetup first rises from "L" (Vss) to "H" (Vcc) as shown in FIG. 16B. Then, a page address PA is set by address signals a0–a13. In this connection, as shown in FIG. 12, address signals a0–a4 are inputted to the predecoder 0–predecoder 31. Meanwhile, address signals a5–a13 are inputted to the block decoder 0–block decoder 511.

After any ones among the 32 predecoders and the 512 block decoders are selected in this way, an output signal of level "H" (Vcc) is outputted. For example, in the case where the word line WL0 is selected, the output signal pre0 of the predecoder 0 and the output signal sel0 of the block decoder 0 go "H" (Vcc) level. Meanwhile, the output signals pre1–pre31 of the predecoder 1–predecoder 31 associated with non-select word lines WL and the output signals sel1–sel511 of the block decoder 1–block decoder 511 go "L" (Vss) level.

In this connection, for changing the applied voltage of the Word line WL0 from Vss to Vneg (−8 V) for programming by the row decoder 21, the levels of individual power supply voltages and control signals are changed as follows. The level of the signal erssetupb is "H" (Vcc), and the input signal hnset and the power supplies hhvpre, hhvpre1 and hnvneg are level-changed at the same timings as in the first embodiment.

First, the control voltage circuit is described with reference to FIG. 13. To the control voltage circuit 0, because the levels of the input signal pre0 and the signal prgsetup are "H" (Vcc), a level "L" (Vss) is outputted to the node 5. Therefore, the control voltage circuit 0 performs the same operation as in the case described for the input signal pre0="L" with the control voltage circuit 0 of the first embodiment. As a result, the level of the output signal hrdab0 is fixed to the "H" state, and changed in voltage from Vcc to Vss along with the level change of the power supply hhvpre1. Meanwhile, in the non-select side control voltage circuit 1–control voltage circuit 31, because the level of the input signals pre1–pre31 is "L" (Vss), the level of the node 5 goes "H" (Vcc), and the control voltage circuits 1–31 perform the same operation as described for the input signal pre0="H" in the control voltage circuit 0 of the first embodiment. As a result, the level of the output signals hrdab1–hrdab31 is fixed to the "L" state, and changed in voltage from Vss to Vbb and further to Vneg along with the level change of the power supply hnvneg1. In addition, in this program operation, the power supplies hhvpre and hhvpre1, as well as the power supplies hnvneg1 and hnvneg take the same value.

Next, operation of the high voltage circuit is described. First, the signal prgsetup is at "H" (Vcc) level as in the foregoing case, and the signal wlon is set to "L" (Vss) level. As a result, the node n6 of the high voltage circuit 0 (input signal sel0="H") goes "H" (Vcc), and the N-channel MOS transistor N25 is turned on so that the P-channel MOS transistor P12 is also turned on. As a result, the node n7 goes the level of the power supply hhvpp, so that the output signal hhvx0 goes Vss. Meanwhile, the non-select side high voltage circuit 1–high voltage circuit 511 (input signals sel1–sel511 "L"), the node n6 of which goes "H" (Vcc) level, also perform the same operation as that of the high voltage circuit 0. As a result, the output signals hhvx1–hhvx511 become Vss.

Next, operation of the low voltage circuit is described. The input signal hnset and the power supplies hhvpre, hhvpre1 and hhvneg are similar to those in the case of the control voltage circuit. Therefore, in the low voltage circuit 0 (input signal sel0="H" (Vcc)), because the case is the same as that of the foregoing control voltage circuit 0 (node n5="H" (Vcc)), the node n9 goes "L" level, and then its voltage changes from Vss to Vbb and further to Vneg along with the level change of the power supply hnvneg. Meanwhile, the node n8 goes "H" level conversely, and so its voltage changes from Vcc to Vss along with the level change of the power supply hhvpre. It is noted that the power supply hners is Vss. The power supply hnvnnx changes in voltage from Vss to Vneg after the power supply hnvneg has fallen to Vneg.

As a result, the output signal hnn0 goes Vss, given that the power supply hnvnnx is Vss. Then, once the power supply hnvnnx has fallen the Vneg, the output signal hnn0 is changed to Vneg by the N-channel MOS transistor N32 that has been turned on.

Also, in the non-select side low voltage circuit 1–low voltage circuit 511 (input signal sel1–sel511="L" (Vss)), the level of the node n9 is "H" because the case is the same with the foregoing control voltage circuit 1–control voltage circuit 511 (node n5="L" (Vss)). Therefore, the low voltage circuits 1–511 change in voltage from Vcc to Vss along with the level change of the power supply hhvpre. Meanwhile, because the level of the node n8 goes "L" conversely, the voltage changes from Vss to Vbb and further to Vneg along with the level change of the power supply hnvneg. It is noted that the power supply hners is Vss. Also, the power supply hnvnnx changes in voltage from Vss to Vneg after the power supply hnvneg has fallen to Vneg.

As a result, the output signals hnn1–hnn511 become Vss in the case where the power supply hnvnnx is Vss. Then, when the power supply hnvnnx falls to Vneg, the output signals are changed to Vss (hners) by P-channel MOS transistors P14 that have been turned on. Thus, the voltage of Vss is maintained.

When these signals or voltage levels are inputted to the driver section 22 of the row decoder 21, the applied voltages of the word lines WL are set as follows. That is, in the select word line WL0 (corresponding to pre=sel="H" in the following Table 6), the level of the output signal hrdab0 is "H" (where the power supply hhvpre is at Vss), and the output signal hhvx0 is Vss. Also, the output signal hnn0 changes from Vss to Vneg. Therefore, to the select word line WL0, Vss is outputted at first, but when the output signal hnn0 changes to Vneg, the N-channel MOS transistor is turned on so that Vneg is outputted.

Meanwhile, in the non-select word line WL31 (corresponding to pre="L", sel="H" in the following Table 6), the level of the output signal hrdab31 is "L" (where the power supply hnvneg is at Vneg), and the output signal hhvx0 is at Vss. Also, the output signal hnn0 changes from Vss to Vneg. Therefore, to the non-select word lines WL31, Vss is first outputted, and then, when the input signal hnn0 changes to Vneg, the P-channel MOS transistor is turned on so that the output signal hhvx0 is outputted. It is noted that because the output signal hnn0 is at Vss, the applied voltage to the non-select word line WL31 remains unchanged, and Vss is outputted.

Also, in the non-select word line WL16352 (corresponding to pre="H", sel="L" in the following Table 6), the level of the output signal hrdab0 is "H" (where the power supply hhvpre is at Vss), the output signal hhvx511 is at Vss, and the output signal hnn511 is at Vss (hners). Therefore, Vss is outputted to the non-select word line WL16352.

Finally, in the non-select word line WL16383 (corresponding to pre=sel="L"), the level of the output signal hrdab0 is "L" (where the power supply hnvneg is at Vneg), the output signal hhvx511 is at Vss, and the output signal hnn511 is at Vss (hners). Therefore, Vss is outputted to the non-select word line WL16383.

As shown above, outputs to the select word lines or non-select word lines are summarized to the above four cases. These are shown in a list in Table 6:

TABLE 6

Output signals of row decoder at programming (where power supply hnvnnx is Vneg)

| pre | Sel | Control voltage circuit hrdab | High voltage circuit hhvx | Low voltage circuit hnn | Output voltage to word line WL |
|---|---|---|---|---|---|
| L | L | L | Vss | Vss (hners) | Vss |
| L | H | L | Vss | Vss → Vneg | Vss |
| H | L | H | Vss | Vss (hners) | Vss |
| H | H | H | Vss | Vss → Vneg | Vss → Vneg |

Consequently, Vneg is applied to the select word line WL0, and Vss is applied to the non-select word lines WL1–WL16383.

As shown in Table 6, simultaneously when a voltage is applied from the row decoder 21 to a word line WL, a voltage of Vprg (e.g., 5 V) is applied to the drain of a memory cell to be programmed via the main bit line BL and besides the source is put into the floating state. By so doing, electrons are pulled out from the floating gate by the FN tunneling phenomenon, so that the threshold of the memory cell lowers to 2 V or lower, thus the program operation being ended.

Thereafter, by returning the power supply hnvnnx from Vneg to Vss, the output to the selected word line WL0 is returned from Vneg to Vss, and the power supply hhvpre, the power supply hnvneg and the input signal hnset are returned to the original state at timings reverse to those at the start of programming. By so doing, the internal state is maintained unchanged even if the applied voltage is changed.

(2) Read Operation Mode

In this case also, a case of reading out a memory cell the control gate of which is connected to the word line WL0 is described. Input and output waveforms to the row decoder 21 in this case are shown in FIGS. 17A–17O.

Figure 17:
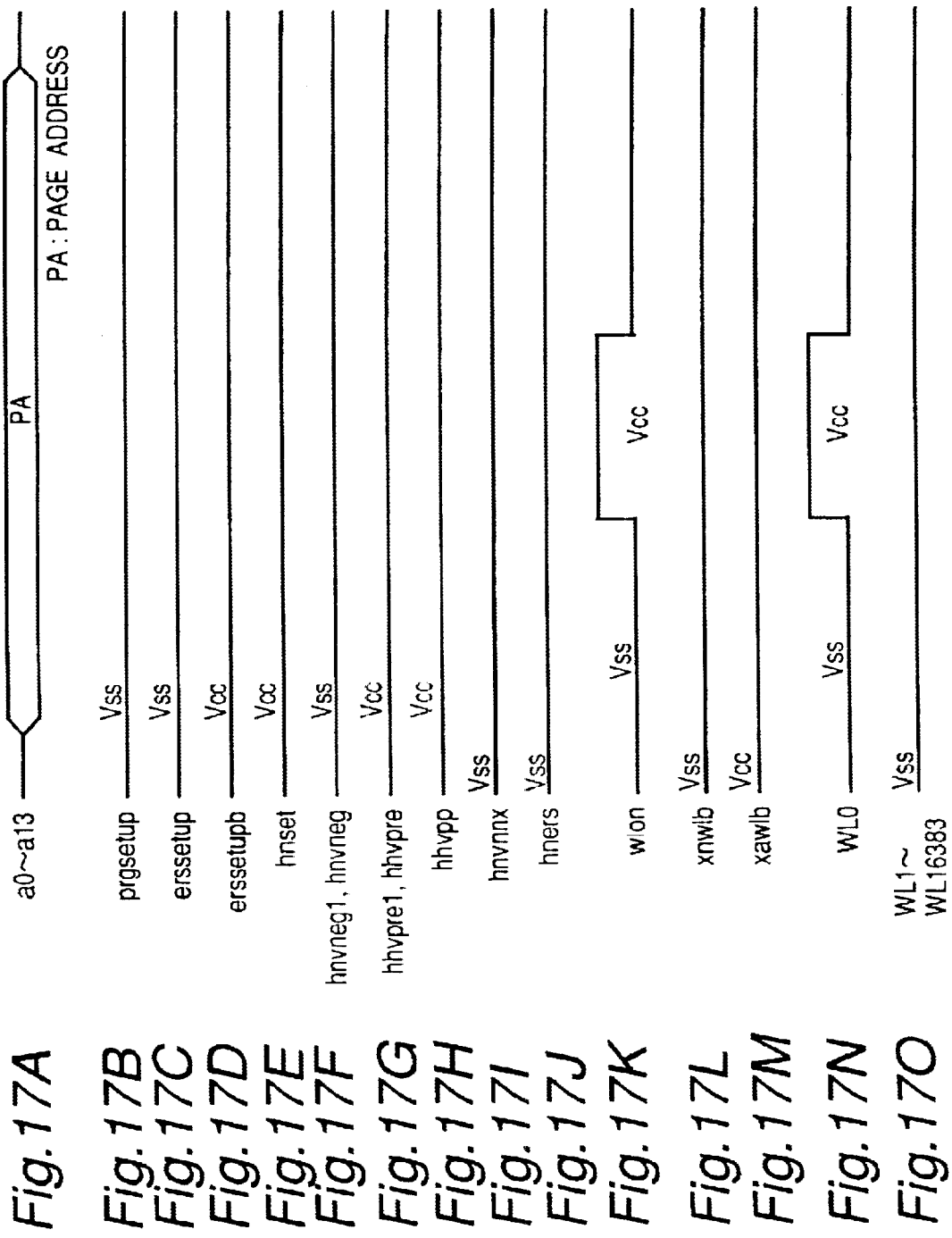
FIGS. 17A–17O are charts showing input and output waveforms for read operation in the row decoder shown in FIG. 12.
Figure 18:
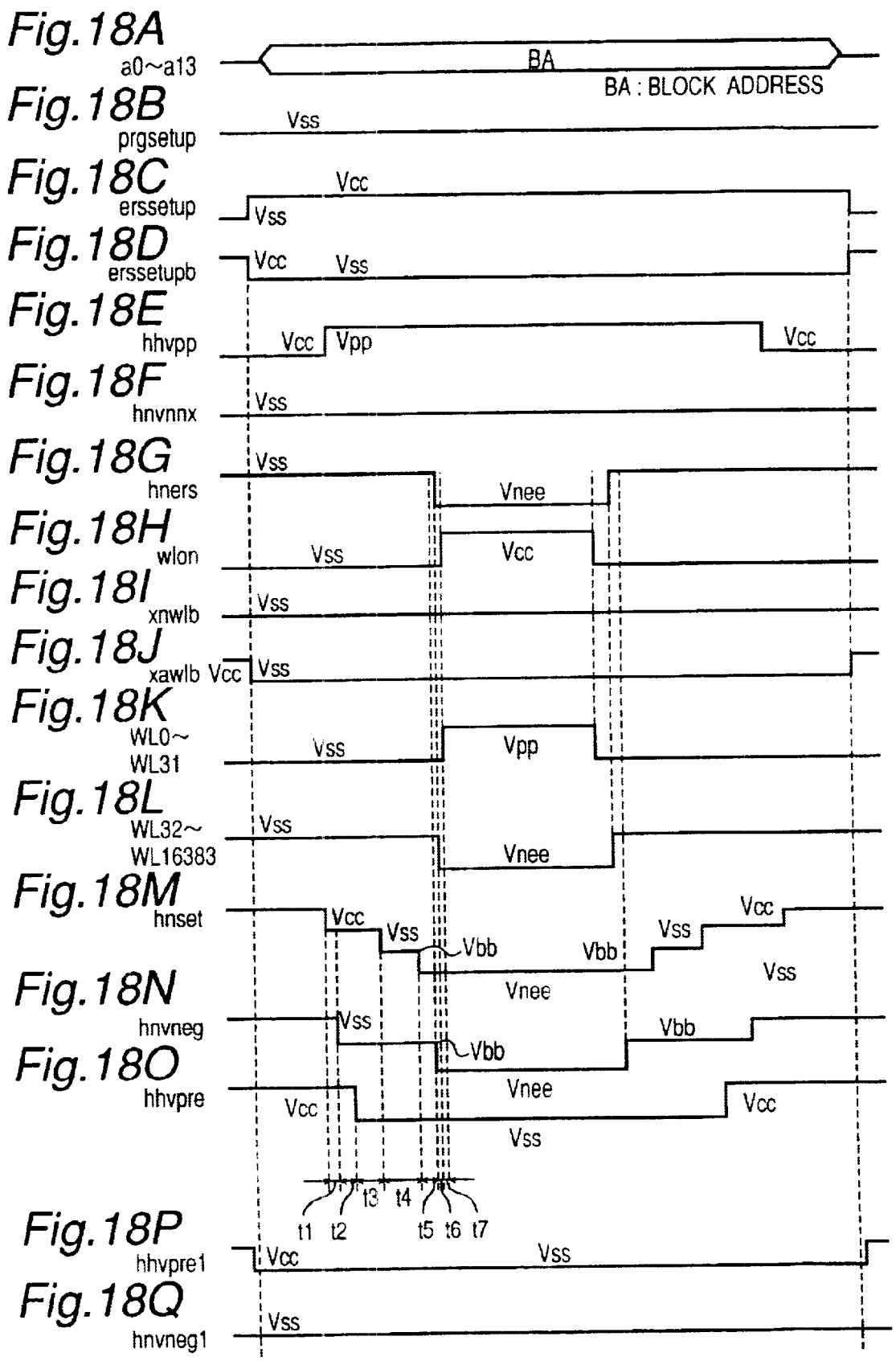
FIGS. 18A–18Q are charts showing input and output waveforms for erase operation in the row decoder shown in FIG. 12.
Figure 19:
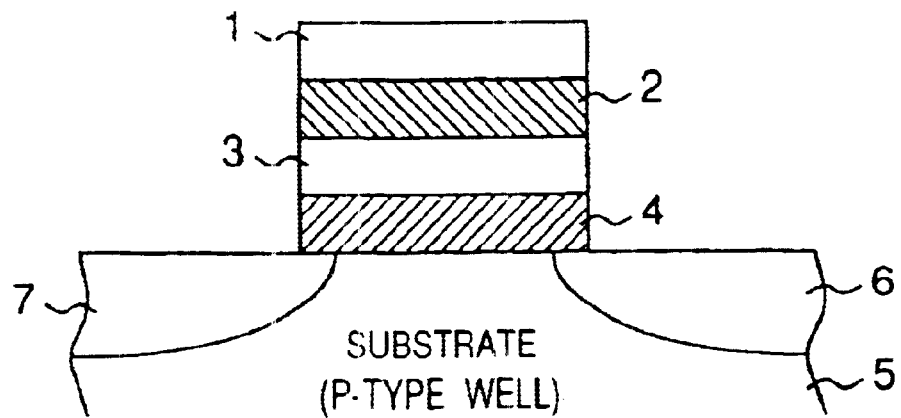
FIG. 19 is a schematic view showing a cross is section of a memory cell in the ACT type flash memory.
Figure 20:
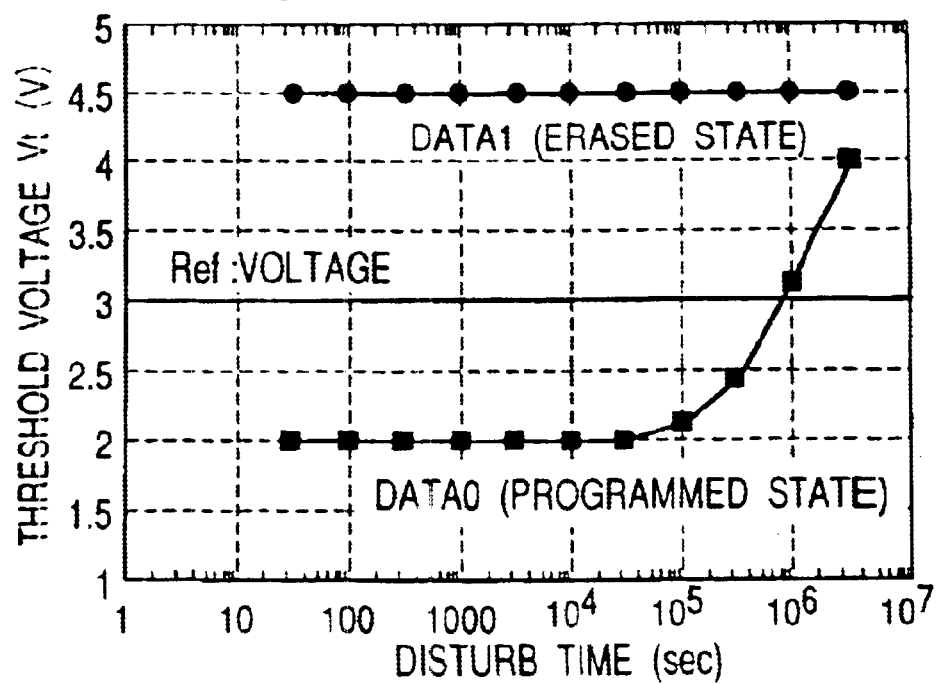
FIG. 20 is a chart showing the relationship between the total application time to a non-select block and the threshold voltage according to an erase method of the prior art.
Figure 21:
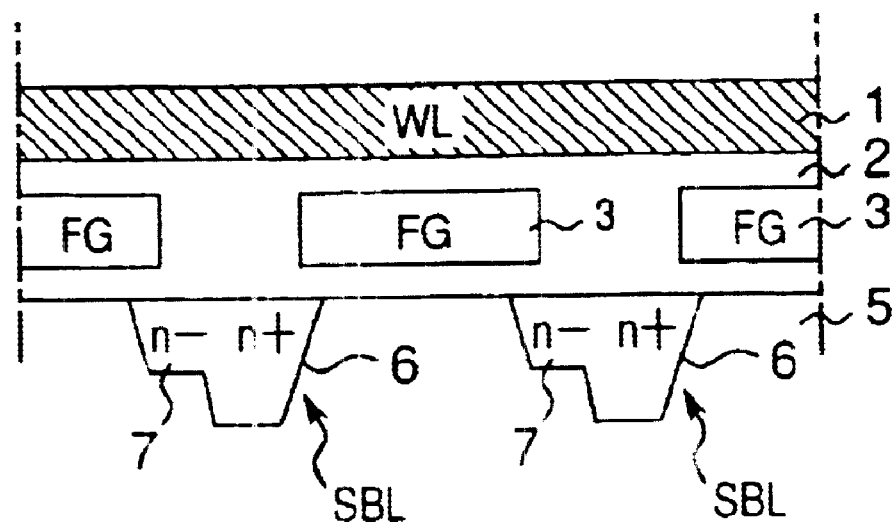
FIG. 21 is a schematic view showing a cross section of an ACT type flash memory device.

As shown in FIGS. 17A–17O, when a read operation is started, the page address PA is first set by addresses a0–a13. Settings of the signals pre and signals sel within the row decoder 21 are the same as in the foregoing program operation. In this embodiment, since the word line WL0 is selected, the signal pre0 and the signal se10 become "H" (Vcc) level, while the other signals pre1–pre31 and signals sel1–sel511 become "L" (Vss) level.

Meanwhile, the input signal erssetupb is set to Vcc, and the signal prgsetup is set to Vss. Also, the signal hnset is set to Vcc, the power supply hnvneg is set to Vss, and the power supply hhvpre is set to Vcc. In read operation, the power supply hnvneg1 and the power supply hhvpre1 are equal in value to hnvneg and hhvpre, respectively. These are the same as the initial settings in the foregoing program operation. It is noted that in the program operation, level change is effected after this in view of withstand voltage so that Vneg is outputted. Further, the signal hners is set to Vss, the signal hhvpp is set to Vcc, and the signal hnvnnx is set to Vss.

First, operation of the control voltage circuit is described. Since the signal prgsetup is at "L" (Vss) level, the level in the node n5 is inverted from the case of the foregoing program operation. Therefore, in the case of the input signal pre="H" (Vcc), the output signal. hrdab goes "L" level, and its voltage goes hnvneg (Vss). Meanwhile, in the case of the input signal pre="L" (Vss), the level of the output signal hrdab goes "H", and its voltage goes hhvpre (Vcc).

Next, operation of the high voltage circuit is described. The signal wlon is raised from "L" (Vss) level to "H" (Vcc) level after the address is established. As a result, in the case of the input signal sel="H" (Vcc), the voltage of the node n6 falls from Vcc to Vss, and the voltage of the node n7 rises from Vss to Vcc (hhvpp). In the case of the input signal sel="L" (Vss), the level of the node n6 is "H" (Vcc) regardless of the change of the signal wlon. As a result, the output signal hhvx becomes Vss.

Next, operation of the low voltage circuit is described. In the case of the input signal sel="H" (Vcc), the voltage of the node n9 is pulled in to Vss. As a result, the voltage of the node n9 goes Vss (hnvneg), and the voltage of the node n8 goes Vcc (hhvpre). In the case of the input signal sel="L" (Vss), on the other hand, the case is of the reverse relation to the foregoing. However, since the power supply hnvnnx and the power supply hners are set to Vss, the output signal hnn becomes Vss.

As a result of the above, for the select word line WLQ (corresponding to pre=sel="H" in the following Table 7), applied voltage is set as follows. That is, because of the settings that the output signal hrdab0 and the output signal hnn0 are at Vss, when the output signal in, hhvx0 rises from Vss to Vcc, the P-channel MOS transistor is turned on. Therefore, the applied voltage to the select word line WL0 changes from Vss to Vcc. Then, by the application of Vcc (e.g. 3 V) to the select word line WL0, a memory cell the control gate of which is connected to this select word line WL0 goes readable. Then, 0 V is applied to the main bit line BL connected to the source of the memory cell to be read, while 1 V is applied to the main bit line BL connected to the drain of the memory cell. Then, by sensing the current flowing through the main bit line BL connected to the drain by the sense circuit (not shown), data held in the memory cell can be read.

Meanwhile, in the non-select word lines WL1–WL16383, first, the output to the word line WL31 (corresponding to pre="L", sel="H" in the following Table 7) is as follows. That is, the output signal hnn0 is Vss, and the output signal hhvx0 rises from Vss to Vcc. However, because the output signal hrdab31 is Vcc, the N-channel MOS transistor is turned on, so that the output to the word line WL31 holds Vss.

Also, the output to the word line WL16352 (corresponding to pre="H", sel="L" in the following Table 7) holds Vss level because the output signal hrdab0, the output signal hhvx511 and the output signal hnn511 are Vss.

Further, the output to the word line WL16383 (corresponding to pre=sel="L" in the following Table 7) holds Vss level, due to the fact that although the output signal hrdab31 is Vcc yet the output signal hhvx511 and the output signal hnn511 are Vss.

As shown above, outputs to the select word lines or the non-select word lines are summarized to the above four cases. These are listed below collectively in Table 7.

TABLE 7

Output signals of row decoder at reading (where signal wlon changes to Vcc)

| pre | Sel | Control voltage circuit hrdab | High voltage circuit hhvx | Low voltage circuit hnn | Output voltage to word line WL |
|-----|-----|---|---|---|---|
| L | L | Vcc | Vss | Vss | Vss |
| L | H | Vcc | Vss → Vcc | Vss | Vss |
| H | L | Vss | Vss | Vss | Vss |
| H | H | Vss | Vss → Vcc | Vss | Vss → Vcc |

Then, upon completion of the read operation, the word line WL0 is returned to Vss level by returning the signal wlon to Vss.

(3) Erase Operation Mode

Erase operation is performed on the block-by-block basis as in the first embodiment. In this case, a case in which a block 0 (i.e., memory cells to the control gates of which the word lines WL0–WL31 are connected) is erased is described. Input and output waveforms of the row decoder 21 in this case are shown in FIGS. 18A–18Q.

First, the level of the erase set signal erssetup is raised from "L" (Vss) to "H" (Vcc). When this occurs, the level of the inverted signal erssetupb falls from "H" (Vcc) to "L" (Vss), conversely. Whereas the level of the signal xnwlb is "L" (Vss), the level of the signal xawlb is lowered from "H" (Vcc) to "L" (Vss). As a result, as in the case of the first embodiment, output signals pre0–pre31 of the predecoder 0–predecoder 31 all go "H" (Vcc) level regardless of the values of a0–a4, thus resulting in the block-by-block operation.

The signal hnset, the power supply hnvneg and the power supply hhvpre are changed in level at the same timings as the voltage level described for the foregoing programming, except a difference that the lowest voltage of the input signal hnset and the power supply hnvneg is Vnee. Meanwhile, the power supply hhvpre1 changes in level from Vcc to Vss before the erase set inverted signal erssetupb falls from Vcc to Vss. Further, the power supply hnvneg1 holds Vss level.

As shown in FIGS. 18A–18Q, when the erase operation starts up, the address signals a0–a13 are inputted to the predecoders and the block decoders as in the case of the foregoing program and read operations. Then, a block address BA is set. Since the level of the signal xawlb is at "L", the output signals pre0–pre31 of all the predecoders go "H" regardless of the values of the addresses a0–a4. Therefore, since the output signal se10 of the block decoder 0 has come to "H" level, it means that the block 0 has been selected. That is, the row decoder 21 operates on the block-by-block basis, and according to the addresses a5–a13.

First, operation of the control voltage circuit is described. Since the inverted signal erssetupb of the erase set signal becomes "L" (Vss), the N-channel MOS transistors N21, N23 of the control voltage circuit are turned on regardless of the level state of the signal pre. Also, since the level of the input signal hnset is "H" (Vcc) at the beginning, the N-channel MOS transistors N22, N24 are also turned on (will later be turned off because the level of the input signal hnset lowers), so that the level of the output signal hrdab is pulled to the "L" (Vss) level. However, because the power supply hhvpre1 and the power supply hnvneg1 have been lowered to Vss as described above, there are no problems in terms of circuits. Therefore, as can be seen from FIG. 13, since the level of the inverted signal erssetupb of the erase set signal is "L" (Vss), the output signals hrdab i all go Vss regardless of the values of the input signals pre i (i=0–31).

Next, operation of the high voltage circuit is described. The level of the signal prgsetup is "L" (Vss), and the level of the signal wlon is initially set to "L" (Vss). Therefore, the level of the node n6 becomes "H" (Vcc) regardless of the value of the input signal sel. As a result, the output signal hhvx becomes Vss. After that, the power supply hhvpp is raised from Vcc to Vpp.

Then, in the non-select block (sel="L" (Vss)), the level of the node n6 becomes "H" (Vcc) so that the output signal hhvx becomes Vss. Meanwhile, in the select block (sel="H" (Vcc)), in the case where the signal wlon is initially at "L" (Vss) level, the output signal hhvx becomes Vss level. However, as the level of the signal wlon changes to "H" (Vcc), the level of the node n6 becomes "L" (Vss). Thus, the output signal hhvx becomes Vpp (=power supply hhvpp (Vpp)).

Next, operation of the low voltage circuit is described. In the low voltage circuit 0 (sel="H" (Vcc)) associated with the select block 0, since the input signal hnset is first at "H" (Vcc) level, the N-channel MOS transistors N28, N29, N30 are turned on, so that the node n9 is pulled to Vss. As a result, as described for the foregoing programming, the node n9 is fixed to "L" level and its voltage is changed from Vss to Vbb and further to Vnee along with the change of the power supply hnvneg. Meanwhile, the node n8 is fixed to the "H" level, and its voltage changes from Vcc to Vss along with the change of the power supply hhvpre.

On the other hand, in the low voltage circuit 1–low voltage circuit 511 (sel="L" (Vss)) associated with the non-select block, since the input signal hnset is first at "H" (Vcc) level, the N-channel MOS transistors N27, N28, N30 are turned on, so that the node n8 is pulled to Vss. As a result, converse to the case of the low voltage circuit 0 associated with the select block 0, the node n8 is fixed to "L" level, and its voltage changes from Vss to Vbb and further to Vnee along with the change of the power supply hnvneg. Meanwhile, the node n9 is fixed to "H" level, and its voltage changes from Vcc to Vss along with the change of the power supply hhvpre.

Then, the power supply hnvnnx is maintained at Vss, and the power supply hners is lowered from Vss to Vnee. This lowering is executed at a timing after the power supply hnvneg is lowered from Vbb to Vnee. After the power supply hners is lowered from Vss to Vnee in this way, the signal wlon is raised from Vss to Vcc. The period over which this signal wlon holds Vcc is the period over which the erase voltage is applied to the word lines WL connected to the control gates of memory cells of the block to be erased.

As a result, the output signal hnn0 (sel="H" (Vcc); Vss at node n8, Vnee at node n9) of the select block 0 is first Vss, given that the power supply hners is Vss. Then, once the power supply hners has been changed to Vnee, the P-channel MOS transistor P13 is turned on, so that Vss (=power supply hnvnnx (Vss)) is outputted. Also, the other output signals hnn1–hnn511 (sel="L" (Vss); Vnee at node n8, Vss at node n9) are first Vss, given that the power supply hners is Vss. However, once the power supply hners is changed to Vnee, the N-channel MOS transistor N31 is turned on, so that Vnee (=power supply hners (Vnee)) is outputted.

The signals and power supplies set as described above are inputted to a driver section 22 of the row decoder 21. Now, because the output signals hrdab0–hrdab31 of all the control voltage circuits are Vss as described above, the output signal hhvx of the high voltage. In circuit 0 (sel="H" (Vcc)) of the select block 0 changes from Vss to Vpp due to the change of the power supply hhvpp as well as to the fact that the signal wlon is at "H" (Vcc) level. Meanwhile, the output signals hhvx1–hhvx511 of the high voltage circuit 1–high voltage circuit 511 (sel="L" (Vss)) associated with the non-select block 1–non-select block 511 hold Vss level.

Also, the output signal hnn0 of the low voltage circuit 0 associated with the select block holds Vss, and the output signals hnn1–hnn511 of the high voltage circuit 1–high voltage circuit 511 of the non-select block change from Vss to Vnee along with the change of the power supply hners.

As a result, in the driver of the select block 0, Vss is first outputted to the word line WL0. Then, when the output signal hhvx0 rises from Vss to Vpp, the P-channel MOS transistor is turned on, so that Vpp is outputted. Meanwhile, in the driver of the non-select block 1–non-select block 511, Vss is first outputted to the word lines WL32–WL16383. Then, when the output signals hnn1–hnn511 lower from Vss to Vnee, the N-channel MOS transistor is turned on, so that Vnee is outputted.

Upon completion of the erase of memory cells the control gates of which are connected to the word lines WL of the select block 0, the signal wlon is returned from Vcc to Vss. Then, the word lines WL0–WL31 return from Vpp to Vss. Next, when the power supply hners is returned from Vnee to Vss, the word lines WL32–WL16383 return from Vnee to Vss.

Thereafter, the signal hnset, the power supply hnvneg and the power supply hhvpre are turned back at the timings reverse to the foregoing. It is noted that the power supply hhvpp, for the erasing, may be raised from Vcc to Vpp before the signal wlon changes from Vss to Vcc, and at an end of the erasing, may be returned from Vpp to Vcc after the signal wlon returns to Vss. However, the timing of change of the power supply hhvpp is not necessarily limited.

From this outward, the level of the signal xawlb is returned from "L" (Vss) to "H" (Vcc), and the level of the power supply erssetup is returned from "H" (Vcc) to "L" (Vss), and thereafter, the power supply hhvpre1 is returned from Vss to Vcc.

Input/output signals of the individual circuits of the row decoder 21 as well as output voltages to the word lines WL during the erase operation described above are listed in Table 8, where sel="H" represents a select block, sel="L" represents a non-select block:

TABLE 8

Output signals of row decoder at erasing (where signal wlon changes from Vss to Vcc)

| pre | Sel | Control voltage circuit hrdab | High voltage circuit hhvx | Low voltage circuit hnn | Output voltage to word line WL |
|---|---|---|---|---|---|
| H | L | Vss | Vss | Vss → Vnee (hners) | Vss → Vnee |
| H | H | Vss | Vss → Vpp | Vss | Vss → Vpp |

By the operation of the row decoder 21 described above, Vpp is applied to the word lines WL0–WL31 of the select block 0. Further, Vnee is applied to the drain and source of the memory cell and the substrate (well) within the memory cell array via the main bit line BL. By so doing, in the memory cells within the select block 0, electrons are injected to the floating gates from the channel layer by the EN tunneling phenomenon, causing the threshold of the memory cells to rise, where when the threshold value becomes 4 V or more, the erase operation ends.

Meanwhile, in the non-select block 1–non-select block 511, Vnee is applied to the word lines WL32–WL16383. On the other hand, Vnee is applied to the main bit lines BL and the substrate (well), which are common to the main bit lines BL and the substrate (well) within the select block 0. Therefore, in the non-select block 1–non-select block 511, the same voltage Vnee is applied to the control gate, drain, source and substrate (well) of each memory cell, thus the non-select blocks being free from any substrate disturb during erasing.

As a result, by virtue of using the row decoder 21, as shown in FIG. 2, even if a total of disturb time exceeds $10^6$ sec, there is almost no fluctuation of threshold voltage Vt even with memory cells of low threshold value (in the programmed state) which are liable to be affected by the substrate disturb at erasing. This makes it possible to realize a nonvolatile semiconductor storage device which is free from occurrence of mis-reads and high in reliability. Further, since the word lines WL of a non-select block are equal in voltage to the substrate (well), the capacity involved in erasing can be reduced, so that the layout area of the charge pump can be reduced.

Also, in this embodiment, each driver of the driver section 22 in the row decoder 21 is comprised of two transistors, the P-channel MOS transistor and the N-channel MOS transistor. Therefore, the area occupied by each driver can be reduced, compared with the case of the first embodiment in which each driver is comprised of four transistors, i.e. two P-channel MOS transistors and two N-channel MOS transistors.

Finally, the use of transistors of low withstand voltage is enabled by performing level change of voltages and signals in this embodiment. This is explained below in detail.

In the row decoder 21, a voltage from Vpp (e.g., 10 V) to Vnee (e.g. −8 V) is outputted to select word lines WL or non-select word lines WL. Therefore, in this case, as it is, transistors to be used require a withstand voltage of 18 V or more including margin. Forming the source region into the DDD (double doped drain) structure or LDD (lightly doped drain) structure so that the transistors have the withstand voltage would cause the transistors to be increased in size.

Thus, by preforming such level change of voltages and signals as described below, use of transistors having a low withstand voltage is enabled. This is explained here according to the erase operation in the second embodiment.

The withstand voltage of transistors required for the individual sections of the row decoder 21 are as follows. Firstly, the control voltage circuit requires a withstand voltage of 8 V by the input signal hnset, the high voltage circuit requires a withstand voltage of 10 V by the power supply hhvpp, the low voltage circuit requires a withstand voltage of 9 V, which is the maximum difference (Vcc–Vbb) between the power supply hhvpre and the power supply hnvneg due to the fact that level change has been done in the low voltage circuit, and the driver requires a withstand voltage of 10 V, which is (Vpp–Vss). Therefore, the transistors used in the second embodiment need only to have a withstand voltage of 10 V or more, not 18 V or more.

In the erase operation (see FIG. 18) in the second embodiment, the timing intervals t1, t2, t3, t4, t5, t6, t7 for voltage change of the input signal hnset, the power supplies hhvpre and hhvheg are set to around 500 nsec. The voltage change of other signals and power supplies are effected at similar timing intervals.

That transistors of relatively low withstand voltage are usable as described above means that transistors can be reduced in size as described above. Thus, it becomes easier to align the drivers with the array pitch of the word lines WL of the memory cell array in the layout process of the row decoder 21. Further, since the withstand voltage of the transistors may be low one, the gate thickness of each transistor may be thinned so that higher operating speed of the transistors can be implemented.

It is noted that concrete voltage values, voltages and timings for level changes of signals and power supplies used in the program, read and erase operations are not limited to the above embodiments, and may be changed as required. Also, the control voltage circuit has been described with the use of the power supplies hhvpre1 and hnvneg1 in the foregoing embodiments. However, it is alternatively possible to make the power supply hhvpre and the power supply hnvneg be power supplies for the latch circuit A and latch circuit B and let these latch circuits output their signals hrda, hrdab in the program and read operations, while let a newly provided switch change over their output signals to Vss in the erase operation.

Further, in the above embodiments, in the erase operation, the same negative voltage as that of the substrate (well) is applied to the non-select word lines so that the non-select word line and the substrate (well) become the same voltage. However, the present invention is not limited to this. In brief, the voltage to be applied to the non-select word line has only to be a negative voltage which is not less than a negative voltage applied to the substrate (well) and yet whose voltage difference from the substrate (well) is a voltage difference free from any substrate disturb.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A row decoder for a nonvolatile semiconductor storage device, which comprises a plurality of blocks of floating gate field effect transistors arrayed along a column direction, wherein the floating gate field effect transistors respectively have a control gate, floating gate, a drain and a source and are electrically information programmable and erasable and wherein the floating gate field effect transistors are arrayed in a matrix shape on a substrate or well, and wherein the block comprises a plurality of row lines connected to the control gate of each of floating gate field effect transistor arrayed along a row direction, and a plurality of column lines connected via respective select transistors to the drain and source of each of floating gate field effect transistors arrayed along a column direction, and wherein the select transistors in each block are simultaneously turned on or off, the row decoder comprising:

control voltage output means for, on the mode-by-mode basis, outputting a control voltage responsive to select/non-select information which is determined according to the address signal;

select voltage output means for, on the mode-by-mode basis, outputting a select voltage responsive to a select state which is determined according to the address is signal;

non-select voltage output means for, on the mode-by-mode basis, outputting a non-select voltage responsive to a non-select state which is determined according to the address signal; and applied voltage select means for, in the erase mode, selecting either one of the select voltage derived from the select voltage output means or the non-select voltage derived from the non-select voltage output means according to the control voltage derived from the control voltage output means, and simultaneously outputting the selected voltage to select word lines of one block while simultaneously outputting the non-selected voltage to non-select word lines of remaining blocks.

2. A row decoder for a nonvolatile semiconductor storage device, which comprises a plurality of blocks of floating gate field effect transistors arrayed alone a column direction wherein the floating gate field effect transistors respectively have a control gate, floating gate, a drain and a source and are, electrically information programmable and erasable and wherein the floating gate field effect transistors are arrayed in a matrix shape on a substrate or well, and wherein the block comprises a plurality of row lines connected to the control gate of each of floating gate field effect transistor arrayed along a row direction, and a plurality of column lines connected via respective select transistors to the drain and source of each of floating gate field effect transistors arrayed alone a column direction, and wherein the select transistors in each block are simultaneously turned on or off, the row decoder comprising:

control voltage output means for, on the mode-by-mode basis, outputting a control voltage responsive to select/non-select information which is determined according to the address signal;

high voltage output means for, on the mode-by-mode basis, outputting a high voltage not less than a specified voltage responsive to a select state which is determined according to the address signal;

low voltage output means for, on the mode-by-mode basis, outputting a low voltage lower than the high voltage responsive to a non-select state which is determined according to the address signal; and applied voltage select means for, in the erase mode, selecting either one of the high voltage derived from the high voltage output means or the low voltage derived from the low voltage output means according to the control voltage derived from the control voltage output means, and simultaneously outputting the high voltage to select word lines of one block as the select voltage while simultaneously outputting the low voltage to nonselect word lines of remaining blocks as the non-select voltage.

3. The row decoder according to claim 1, wherein in the erase mode, the select voltage is a positive voltage, while the non-select voltage is a negative voltage; and an absolute value of the non-select voltage is equal to an absolute value of a negative voltage applied to a substrate or well of the non-volatile semiconductor storage device.

4. The row decoder according to claim 2, wherein in the erase mode, the select voltage is positive voltage, while the non-select voltage is a negative voltage; and an absolute value of the non-select voltage is equal to an absolute value of a negative voltage applied to a substrate or well of the nonvolatile semiconductor storage device.

* * * * *